United States Patent
Nazar et al.

(10) Patent No.: US 12,379,899 B2
(45) Date of Patent: Aug. 5, 2025

(54) PERFORMING MULTIPLE BIT COMPUTATION AND CONVOLUTION IN MEMORY

(71) Applicant: Apple Inc., Cupertino, CA (US)

(72) Inventors: Shahzad Nazar, Fremont, CA (US); Bharan Giridhar, Palo Alto, CA (US); Mohamed H. Abu-Rahma, Mountain View, CA (US); Ajay Bhatia, Saratoga, CA (US); Mayur V. Joshi, San Carlos, CA (US); Yildiz Sinangil, Campbell, CA (US); Aravind Kandala, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/417,868

(22) Filed: Jan. 19, 2024

(65) Prior Publication Data
US 2024/0231758 A1    Jul. 11, 2024

Related U.S. Application Data

(62) Division of application No. 16/953,093, filed on Nov. 19, 2020, now Pat. No. 11,914,973.

(51) Int. Cl.
*G06F 7/544* (2006.01)
*G06F 7/523* (2006.01)
(Continued)

(52) U.S. Cl.
CPC ............ *G06F 7/5443* (2013.01); *G06F 7/523* (2013.01); *G06F 17/15* (2013.01); *H03M 1/46* (2013.01); *G06N 20/00* (2019.01)

(58) Field of Classification Search
CPC ... H03M 1/46–466; G06N 20/00; G06N 3/04; G06N 3/0442; G06N 3/0464;
(Continued)

(56) References Cited

U.S. PATENT DOCUMENTS 5,014,235 A * 5/1991 Morton ................... G06F 17/16
365/185.11
11,176,991 B1    11/2021  Shaik et al.
(Continued)

FOREIGN PATENT DOCUMENTS

EP          3370145 A1 *  9/2018  ............. G06F 7/523

OTHER PUBLICATIONS

J.W. Su et al., 15.2A 28nm 64Kb Inference-Training Two-Way Transpose Multibit 6T SRAM Compute-in-Memory Macro for AI Edge Chips, 2020 IEEE International Solid-State Circuits Conference, Apr. 2020 (Year: 2020).*

*Primary Examiner* — Emily E Larocque
(74) *Attorney, Agent, or Firm* — Kowert, Hood, Munyon, Rankin & Goetzel, P.C.; Dean M. Munyon

(57) ABSTRACT

A compute-memory circuit included in a computer system includes multiple data storage cells and multiplier circuits. The data storage cells store weight values associated with a first operand. The multiplier circuits are coupled to a global bit line and receive the weight values via local bit lines coupled to the data storage cells. Using the received weight values and activation signals indicative of a second operand, the multiplier circuits modify a voltage level of the global bit line. The resultant voltage level on the global bit line is indicative of a product of the first and second operands, and can be converted to a digital value using an analog-to-digital converter circuit.

20 Claims, 19 Drawing Sheets

(51) Int. Cl.
*G06F 17/15* (2006.01)
*G06N 20/00* (2019.01)
*H03M 1/46* (2006.01)

(58) Field of Classification Search
CPC ....... G06N 3/063; G06F 7/523; G06F 7/5443; G06F 17/15; G06F 17/153; G06F 17/16
See application file for complete search history.

(56) References Cited

U.S. PATENT DOCUMENTS

| | | |
|---|---|---|
| 2017/0337466 A1 | 11/2017 | Bayat et al. |
| 2019/0042160 A1 | 2/2019 | Kumar et al. |
| 2019/0042199 A1 | 2/2019 | Sumbul et al. |
| 2019/0043560 A1 | 2/2019 | Sumbul et al. |
| 2020/0034686 A1 | 1/2020 | Chiu et al. |
| 2020/0312405 A1* | 10/2020 | Ho ................ G11C 11/4085 |
| 2021/0240442 A1 | 8/2021 | Srivastava et al. |
| 2021/0390382 A1 | 12/2021 | Kwon et al. |
| 2022/0066740 A1 | 3/2022 | Radhadevi et al. |

* cited by examiner

|         | | | | |
|---------|---|---|---|---|
| Cycle 0 | $x0_0w0_0$ | $x0_1w1_0$ | $x0_2w2_0$ | $x0_3w3_0$ |
| Cycle 1 | $x0_0w0_1$ | $x0_1w1_1$ | $x0_2w2_1$ | $x0_3w3_1$ |
| Cycle 2 | $x0_0w0_2$ | $x0_1w1_2$ | $x0_2w2_2$ | $x0_3w3_2$ |
| Cycle 3 | $x0_0w0_3$ | $x0_1w1_3$ | $x0_2w2_3$ | $x0_3w3_3$ |
| Cycle 4 | $x1_0w0_0$ | $x1_1w1_0$ | $x1_2w2_0$ | $x1_2w3_0$ |

FIG. 14

PERFORMING MULTIPLE BIT COMPUTATION AND CONVOLUTION IN MEMORY

PRIORITY CLAIM

The present application is a divisional of U.S. application Ser. No. 16/953,093, entitled "Performing Multiple Bit Computation and Convolution in Memory," filed Nov. 19, 2020, the disclosure of which is incorporated by reference herein in its entirety.

BACKGROUND

Technical Field

Embodiments described herein relate to integrated circuits, and more particularly, to techniques for performing computation operations using memory circuits.

Description of the Related Art

Modern computer systems are being asked to perform increasingly complex tasks, such as language processing, image recognition, and the like. To handle such tasks, different classes of algorithms, such as machine learning algorithms, are being employed. Machine learning algorithms often rely on a set of training data from which a model is generated. The generated model is then used to perform a particular processing task, such as image recognition.

Executing machine learning algorithms can often result in repeatedly performing computation intensive operations such as multiply and accumulate operations. These types of operation tend to not map well to conventional computer systems. For example, execution of these operations on systems that are based on processors or processor cores configured to execute software or program instructions often result in excessive power dissipation and undesirable performance. To improve the energy efficiency of machine learning algorithms, some computer systems employ in-memory computing techniques, in which a matrix to be operated upon is stored in a memory. The memory is accessed using operand data to activate multiple rows of the memory in parallel to generate a product of the operand and the stored matrix.

SUMMARY OF THE EMBODIMENTS

Various embodiments for performing computations in a memory circuit are disclosed. Broadly speaking, a compute-memory circuit includes a plurality of data storage cells and a plurality of multiplier circuits. The data storage cells are configured to store respective bits of multiple weight values. The multiplier circuits are coupled to a common global bit line and are configured to receive respective subsets of the weight values. Using the received weight values and corresponding activation signals, the multiplier circuits are configured to generate respective partial products, and modify the voltage level of the global bit line based on the partial products. By modifying the voltage level of the global bit line, the compute-memory circuit accumulates the partial products such that the resultant voltage of the global bit line corresponds to a product of first and second operands, whose values are encoded in the activation signal and weight values, respectively. By performing computation on global rather than local bit lines, standard data storage cells can be employed, improving the area efficiency of the compute-memory circuit.

BRIEF DESCRIPTION OF THE DRAWINGS

The following detailed description makes reference to the accompanying drawings, which are now briefly described.

FIG. 14 is a chart depicting the generation of different partial products during different cycles of a compute-memory circuit.

DETAILED DESCRIPTION OF EMBODIMENTS

Figure 1:
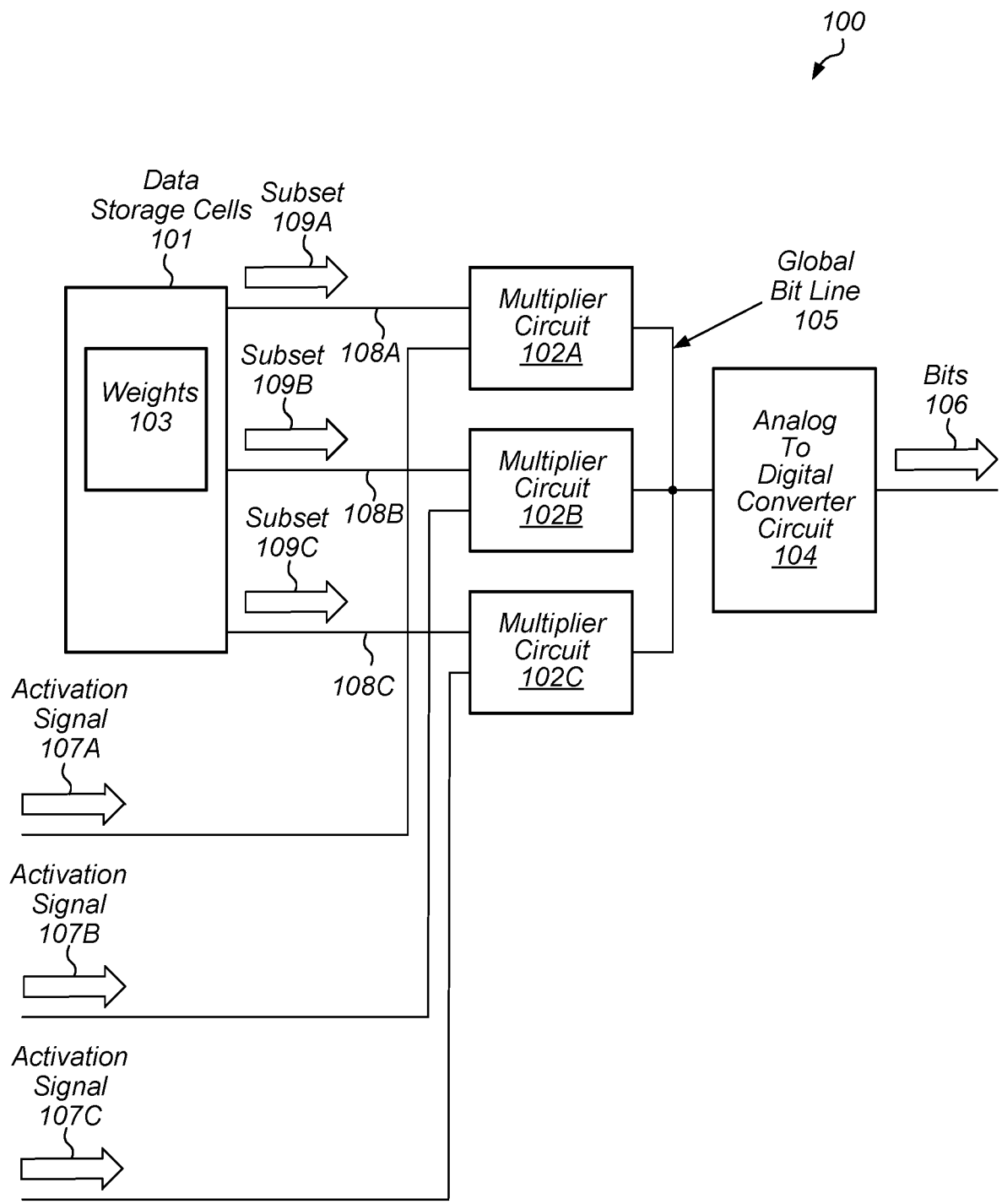
FIG. 1 is a block diagram of an embodiment of a compute-memory circuit.

As computer hardware and software continue to evolve, machine learning is increasingly being employed for certain types of computing tasks. As used and defined herein, "machine learning" is an application of artificial intelligence that provides computer systems the ability to learn and improve from experience without being explicitly programmed. For example, machine learning may be used in such areas as image processing and recognition, self-driving vehicles, natural language processing, and the like. Machine learning may, in various circumstances, employ a model developed from training data. The model is then used to analyze data associated with a particular application.

The algorithms used to implement machine learning do not always lend themselves to execution on conventional computer hardware. Machine learning algorithms can include many multiply-and-accumulate operations, which can result in high power consumption and poor performance on conventional computer hardware, which is not necessarily optimized for high-volume multiply-and-accumulate operations. To provide solutions for such multiply-and-accumulate operations that maintain performance while consuming less power, some computer systems employ in-memory computing techniques.

Rather than retrieving operands from memory and performing, using an arithmetic logic unit, repeated multiplications and additions, in-memory computation involves storing a matrix of numbers (often referred to as "weights") in a compute-memory circuit and operating on the matrix of numbers using circuits within the compute-memory circuit. The compute-memory circuit may be implemented using static random-access memory (SRAM) storage cells, non-volatile memory storage cells, or any other suitable type of storage cell configured to store values indicative of a logic value.

Compute-memory circuits may employ a variety of techniques for performing a multiply-and-accumulate operation. In general, however, such techniques involve activating (or "reading") multiple rows within an array based on an operand value. Each activated row generates a product of a weight value stored in that row and a corresponding bit of the operand. The products generated by the activated rows are then added, in an analog fashion, on the bit lines of the compute-memory circuit.

Such solutions for designing compute-memory circuits can require the use of specialized data storage or "bit" cells that have additional functionality to aid in the computation operation. These specialized cells can be larger in area than standard bit cells and can reduce area efficiency of a memory array circuit. Techniques described in the present disclosure allow for using standard bit cells by moving the computation operation from local bit lines to global bit lines within a memory array circuit. By employing standard high-density bit cells and doing computation on global bit lines, a more area efficient compute-memory circuit can be achieved. Such bit cells are optimized for area efficiency and yield and are often provided as part of a semiconductor manufacturing process.

A block diagram illustrating an embodiment of a compute-memory circuit is depicted in FIG. 1. As illustrated, compute-memory circuit 100 includes data storage cells 101, multiplier circuits 102A-C, and analog-to-digital converter circuit 104. Data storage cells 101 are configured to store weights 103. Individual ones of weights 103 may include multiple bits that are stored in corresponding ones of data storage cells 101. In various embodiments, data storage cells 101 are arranged in rows and columns, with data storage cells on a particular row coupled to a common word line, and data storage cells along a particular column coupled to a common local bit line.

Multiplier circuits 102A-C are coupled to global bit line 105 and configured to receive corresponding ones of activation signals 107A-C. In various embodiments, the plurality of activation signals is indicative of a first operand. In response to receiving a respective one of activation signals 107A-C, multiplier circuits 102A-C are configured to receive subsets 109A-B that are respective subsets of weights 103 from data storage cells 101 via local bit lines 108A-C. In various embodiments, subsets 109A-B may include a plurality of bits from a corresponding one of weight 103.

Multiplier circuits 102A-C are further configured to modify a voltage level of global bit line 105 using subsets 109A-B and activation signals 107A-C, respectively. As described below, multiplier circuits 102A-C may employ various techniques (e.g., resistive divider circuits) to change the voltage level of global bit line 105. The resulting voltage on global bit line 105 may be one of multiple analog voltage levels, each corresponding to a different value of a sum of partial products generated by multiplier circuits 102A-C. By combining partial products on global bit lines 105 as opposed to local bit lines 108A-C, the need for specialized data storage cells is eliminated, and standard data storage cells (e.g., SRAM 6-transistor bit cells) can be used to implement data storage cells 101, resulting in better area efficiency for compute-memory circuit 100.

Analog-to-digital converter circuit 104 is configured to convert the voltage level of global bit line 105 to bits 106 whose value is indicative of a product of the first operand and the second operand. Although only a single analog-to-digital converter circuit is depicted in the embodiment of FIG. 1, in other embodiments additional analog-to-digital converter circuits may be employed to increase a number of bits in bits 106 to improve accuracy. As described below, analog-to-digital converter circuit 104 may be implemented according to one of various analog-to-digital converter circuit topologies.

Figure 2:
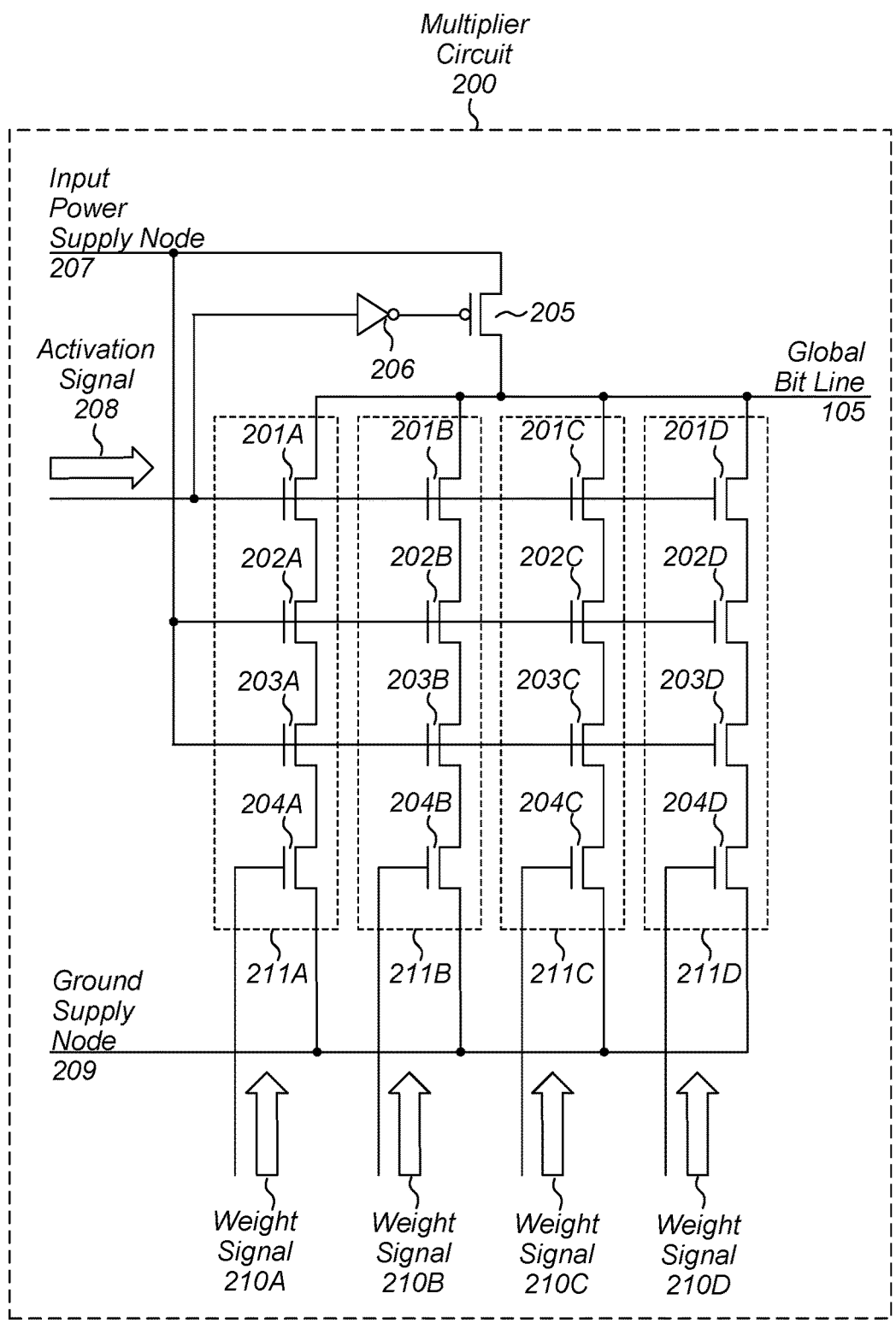
FIG. 2 is a block diagram of an embodiment of a multiplier circuit.

Various circuit topologies may be employed to implement the multiplication and digital-to-analog conversion operations performed by multiplier circuits 102A-102C. One such technique employs the use of resistive divider circuits, an embodiment of which is depicted in FIG. 2. As illustrated, multiplier circuit 200 includes devices 201A-D, 202A-D, 203A-D, 204A-D, device 205, and inverter 206.

Devices 201A, 202A, 203A, and 204A are included in device stack 211A, while devices 201B, 202B, 203B, and 204B are included in device stack 211B. In a similar fashion, devices 201C, 202C, 203C, and 204C are included in device stack 211C, while devices 201D, 202D, 203D, and 204D are included in device stack 211D. As used herein a device stack refers to a set of serially coupled devices. Each of device stacks 211A-D are coupled between global bit line 105 and ground supply node 209. Although only four device stacks are depicted in the embodiment of FIG. 2, in other embodiments, different numbers of device stacks and different numbers of devices within the device stack are possible and contemplated.

Respective control terminals of devices 201A-D are coupled to activation signal 208. In various embodiments, activation signal 208 may correspond to any of activation signals 107A-C as depicted in FIG. 1. Respective control terminals of devices 202A-D and 203A-D are coupled to input power supply node 207. Respective control terminals of devices 204A-D are coupled to weight signals 210A-D. In various embodiments, weight signals 210A-D may correspond to any of weights 103 as depicted in FIG. 1.

An input of inverter 206 is coupled to activation signal 208. Inverter 206 is configured to generate an output signal coupled to a control terminal of device 205 that has an opposite logical polarity of activation signal 208. Device 205 is coupled between input power supply node 207 and global bit line 105.

When activation signal 208 is inactive (e.g., at a logical-0 value), devices 201A-D are inactive, de-coupling the rest of device stacks 211A-D from global bit line 105. The output of inverter 206 is at a logical-1 value, setting device 205 to an inactive set as well. As described above, while activation signal 208 is inactive, weight signals 210A-D may be retrieved from data storage cells 101.

When activation signal 208 is active (e.g., at a logical-1 value), devices 201A-D are active, coupling the rest of device stacks 211A-D to global bit line 105. Since inverter 206 inverts the logical polarity of activation signal 208, device 205 is also active. With device 205 active, and devices stacks coupled to global bit line 105, different resistive conductive paths exist between global bit line 105 and ground supply node 209. With devices 202A-D and 203A-D active since their control terminals are coupled to input power supply node 207, depending on the values of weight signals 210A-D, different ones of devices 204A-D can be active, allowing current to flow through device stacks 211A-D from global bit line 105 into ground supply node 209. The resultant voltage level on global bit line 105 corresponds to a product of the value of an operand corresponding to activation signal 208, and a weight value whose bits correspond to weight signals 210A-D.

To generate a wide range of different voltage that correspond to the different values of the product described above, devices 204A-D may have different transconductance values. In various embodiments, the different transconductance values may be achieved through the adjustment of a physical characteristic (e.g., the width) of devices 204A-D. For example, the width of device 204C may be twice the width of device 204D, the width of device 204B may twice that of device 204C, and the width of device 204A may be twice the width of device 204B. By adjusting device sizes in this fashion, 16 analog voltage levels that reside between ground and the voltage level of input power supply node 207 may be realized. Each of the analog voltage levels corresponds to a different value of the aforementioned product.

In various embodiments, devices 201A-D, 202A-D, 203A-D, and 204A-D may be implemented as n-channel metal-oxide semiconductor field-effect transistors (MOSFETs) or any other suitable transconductance device. In some embodiments, device 205 may be implemented as a p-channel MOSFET or other suitable transconductance device. It is noted that in various embodiments, devices 201A-D, 202A-D, 203A-D, and 204A-D may be implemented with longer channel lengths than standard logic devices in order to reduce a DC current that flows through the device stacks when multiplier circuit 200 is activated, thereby reducing power consumption.

Figure 3:
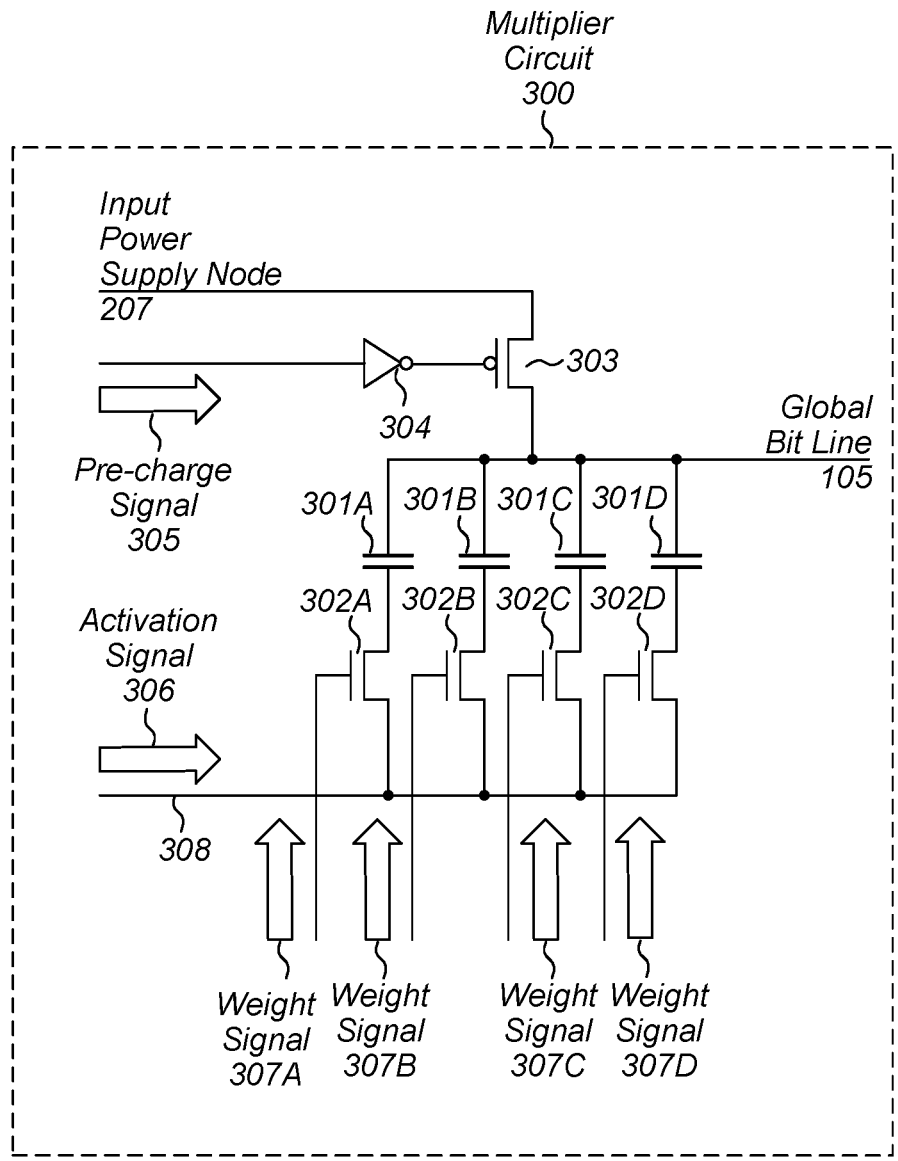
FIG. 3 is a block diagram of a different embodiment of a multiplier circuit.

As noted above, there are a variety of circuit techniques that can be employed to perform a multiplication operation. A block diagram of a different embodiment of a multiplier circuit is depicted in FIG. 3. As illustrated, multiplier circuit 300 includes capacitors 301A-D, devices 302A-D, inverter 304, and device 303.

Capacitor 301A is coupled between device 302A and global bit line 105, while capacitor 301B is coupled between device 302B and global bit line 105. In a similar fashion, capacitor 301C is coupled between device 302C and global bit line 105, while capacitor 301D is coupled between device 302D and global bit line 105. It is noted that the values of capacitors 301A-D may be different. For example, in some cases, the capacitor values may be weighted such that a value of capacitor 301B is twice that of a value of capacitor 301A, and so forth. In various embodiments, capacitors 301A-D may be implemented as metal-oxide-metal (MOM) capacitors, metal-insulator-metal (MIM) capacitors, or any other suitable capacitor structure available on a semiconductor manufacturing process.

Devices 302A-D are further coupled to node 308. Device 302A is controlled by weight signal 307A, while device 302B is controlled by weight signal 307B. In a similar fashion, device 302C is controlled by weight signal 307C, while device 302D is controlled by weight signal 307D. Weight signals 307A-D correspond to particular bits of a given weight of weights 103 stored in data storage cells 101. In some cases, devices 302A-D may be implemented as n-channel MOSFETs, or any other suitable transconductance device.

Based on weight signals 307A-D, different ones of devices 302A-D may be activated, coupling particular ones of capacitors 301A-D to node 308. In response to an assertion of activation signal 306, and based on which of devices 302A-D are active, different amounts of charge may be added (or removed) from global bit line 105. The resultant change in voltage of global bit line 105, corresponds to a partial product of weight signals 307A-D and activation signal 306. It is noted, that activation signal 306 may be either active high or active low. As described above, the resultant voltage of global bit line 105 can be converted to multiple bits by analog-to-digital converter circuit 104 to obtain a digital version of the product.

Device 303 is coupled between input power supply node 207 and global bit line 105, and is controlled by an output of inverter 304. In various embodiments, inverter 304 is configured, in response to receiving an input signal, to generate a signal on its output that has an opposite local polarity than the input signal. For example, in response to an assertion of pre-charge signal 305 to a logical-1 value, inverter 304 generates a signal with a logical-0 value on its output, which activates device 303. When device 303 is activated, global bit line 105 is coupled to input power supply node 207, thereby pre-charging global bit line 105 to a voltage level of input power supply node 207.

In some embodiments, device 303 may be implemented as a p-channel MOSFET. Inverter 304 may be implemented as a CMOS inverting amplifier, or any other suitable logic circuit configured to generate an output signal with an opposite logical polarity of its input signal.

Figure 4:
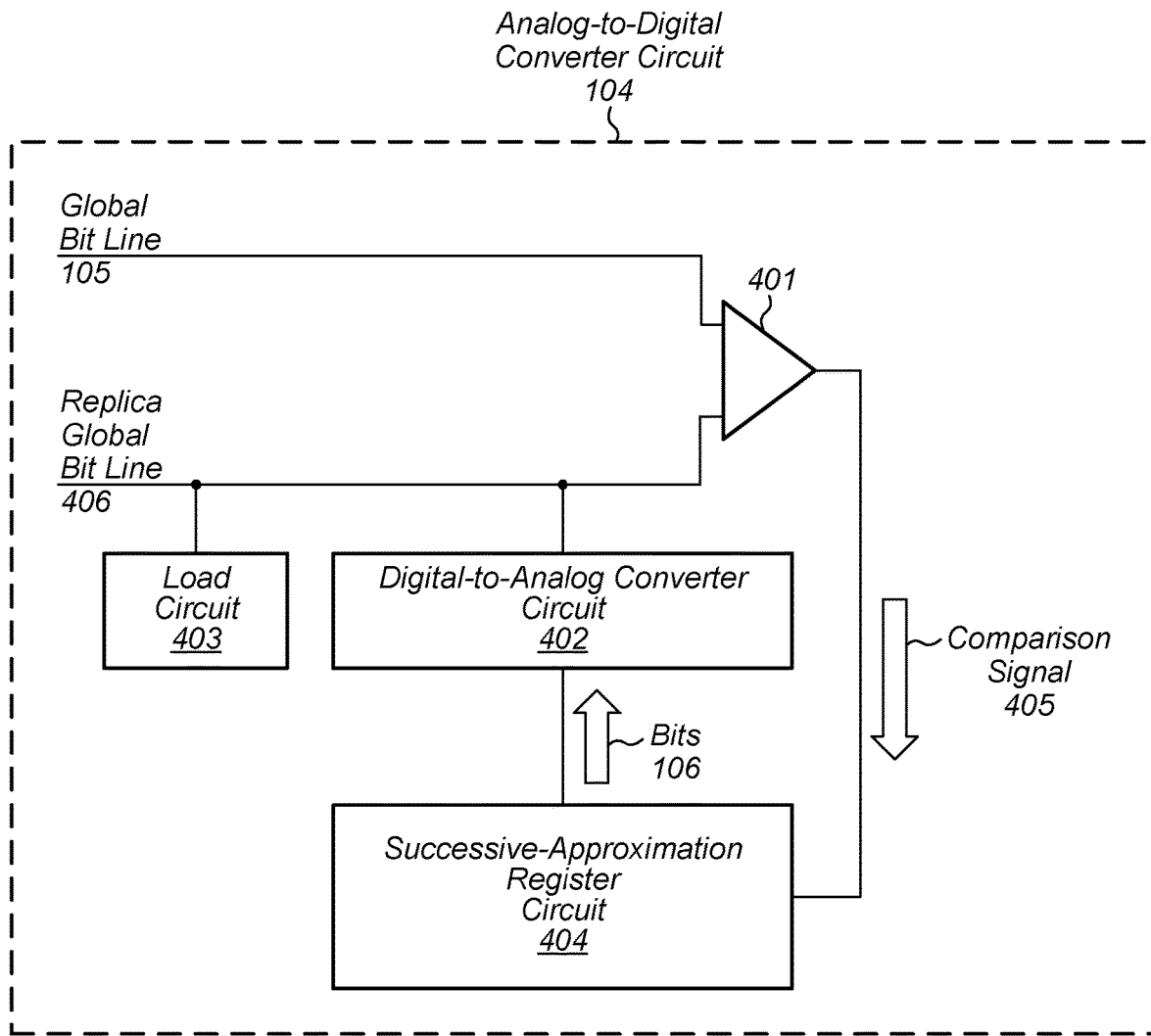
FIG. 4 is a block diagram of an embodiment of an analog-to-digital converter circuit.

Turning to FIG. 4, an embodiment of analog-to-digital converter circuit 104 is depicted. As illustrated, analog-to-digital converter circuit 104 includes amplifier circuit 401, digital-to-analog converter circuit 402, load circuit 403, and successive-approximation register circuit 404.

Amplifier circuit 401 is configured to generate comparison signal 405 using respective voltage levels of global bit line 105 and replica global bit line 406. In various embodiments, amplifier circuit 401 may generate comparison signal 405 such that comparison signal 405 may have one logic value when the voltage level of global bit line 105 is less than the voltage level of replica global bit line 406, and a different logic value when the voltage level of replica global bit line 406 is greater than the voltage level of global bit line 105. Amplifier circuit 401 may, in some embodiments, be implemented as a comparator circuit.

Load circuit 403 may include various circuit elements (e.g., MOSFETs) to mimic the load present on global bit line 105. By making the load on replica global bit line 406 similar to that of global bit line 105, the voltage level of replica global bit line 406 may be used by digital-to-analog converter circuit 402 and successive-approximation register circuit 404 to determine a value for bits 106 that correspond to the voltage level of global bit line 105. In various embodiments, load circuit 403 may be implemented using MOSFETs, capacitors, metal traces, or any other suitable circuit element.

Successive-approximation register circuit 404 is configured to modify a value encoded in bits 106 based on a logic value of comparison signal 405. In various embodiment, successive-approximation register circuit 404 may modify the value encoded in bits 106 using a binary search or other suitable algorithm. In various embodiments, successive-approximation register circuit 404 may be implemented as a sequential logic circuit.

Digital-to-analog converter circuit is configured to generate a voltage level on replica global bit line 406 using bits 106. In various embodiments, digital-to-analog converter circuit 402 may be implemented using an interpolating digital-to-analog converter circuit employing delta-sigma modulation, a binary-weighted digital-to-analog converter circuit, or another other suitable type of digital-to-analog converter circuit.

As successive-approximation register circuit 404 changes the value of bits 106, digital-to-analog converter circuit 402 modifies the voltage level of replica global bit line 406. The modified voltage level of replica global bit line 406 is compared to the voltage level of global bit line 105 by amplifier circuit 401 to update the value of comparison signal 405. The process repeats until the difference between the respective voltage levels of global bit line 105 and replica global bit line 406 are below a threshold value, at which point, bits 106 encode a numeric representation of the voltage level of global bit line 105 and, therefore, a numeric representation of the sum of the partial products represented by the voltage level on global bit line 105.

The inventors have also realized that power consumption of a compute-memory circuit may be managed using different arrangement of the multiplier circuit and analog-to-digital converter circuits. By selecting a particular arrangement for a compute-memory circuit targeted for a given application, circuit designers can trade-off latency for power consumption or vice versa.

Figure 5:
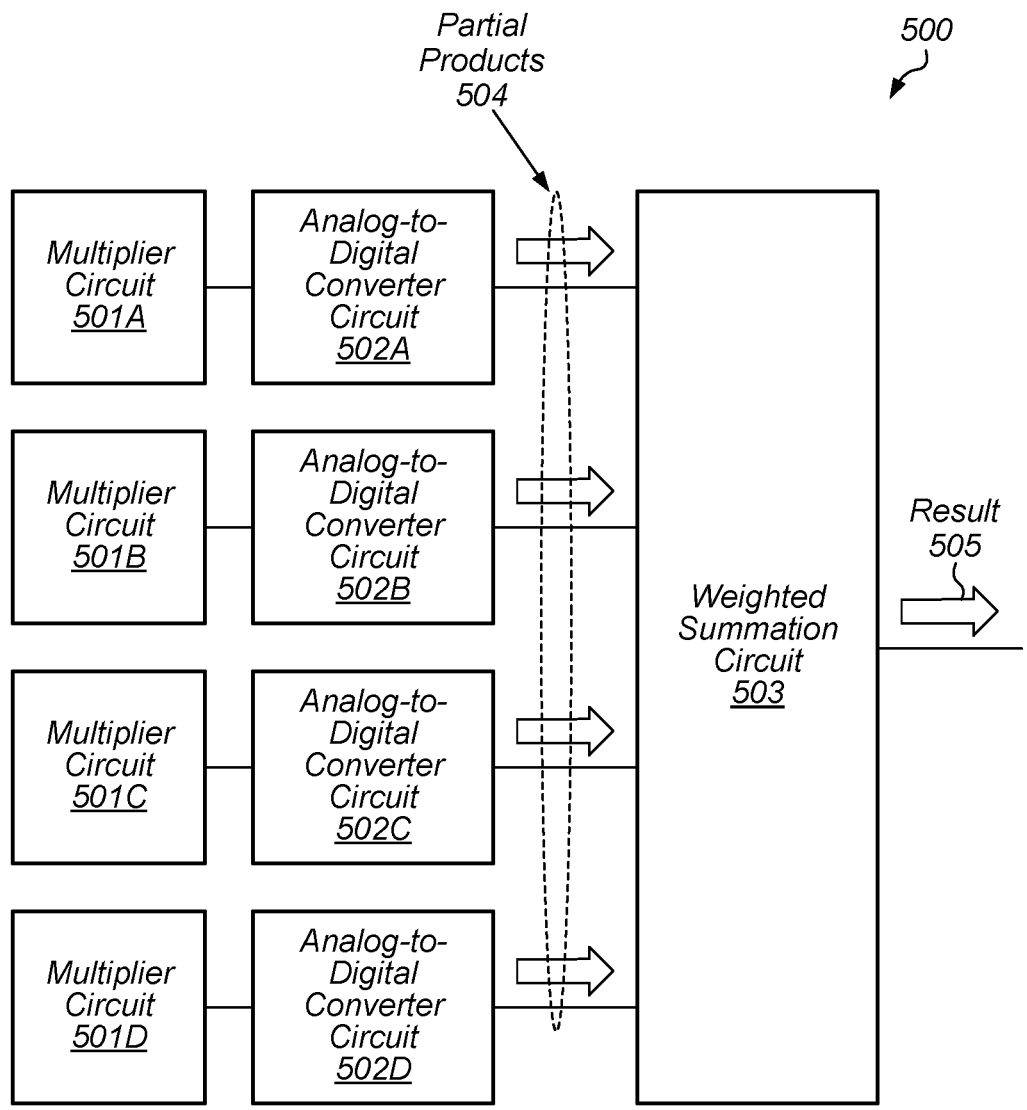
FIG. 5 is a block diagram depicting a different embodiment of a compute-memory circuit.

Turning to FIG. 5, an embodiment of a compute-memory circuit is depicted. As illustrated, compute-memory circuit 500 includes multiplier circuits 501A-D, analog-to-digital converter circuits 502A-D, and weighted-summation circuit 503.

Multiplier circuits 501A-D may be implemented using either multiplier circuit 200 as depicted in FIG. 2, multiplier circuit 300 as depicted in FIG. 3, or any other suitable multiplier circuit with the capabilities described above. Respective outputs (e.g., global bit lines) of multiplier circuits 501A-D are coupled to corresponding ones of analog-to-digital converter circuits 502A-D.

Analog-to-digital converter circuits 502A-D may be implemented using analog-to-digital converter circuit 104 as depicted in FIG. 4, or any other suitable analog-to-digital converter circuit configured to generate a plurality of bits using the voltage level of an input signal. Analog-to-digital converter circuits 502A-D are configured to generate partial products 504 using the outputs of multiplier circuits 501A-D. In various embodiments, a given one of analog-to-digital converter circuits 502A-D generates multiple data bits corresponding a given one of partial products 504.

Weighted-summation circuit 503 is configured to generate result 505 using partial products 504. In various embodiments, weighted-summation circuit 503 may be implemented as a full-adder circuit configured to add the bits included in partial products 504A to generate result 505. In some cases, different ones of partial products 504 may be weighted differently during the summation process.

It is noted that all of multiplier circuits 501A-D, analog-to-digital converter circuits 502A-D, and weighted-summation circuits 503 may be active in parallel. In such cases, the latency to achieve result 505 may be minimized, at the expense of an increase in power consumption due to all of the aforementioned circuits being active in parallel.

Figure 6:
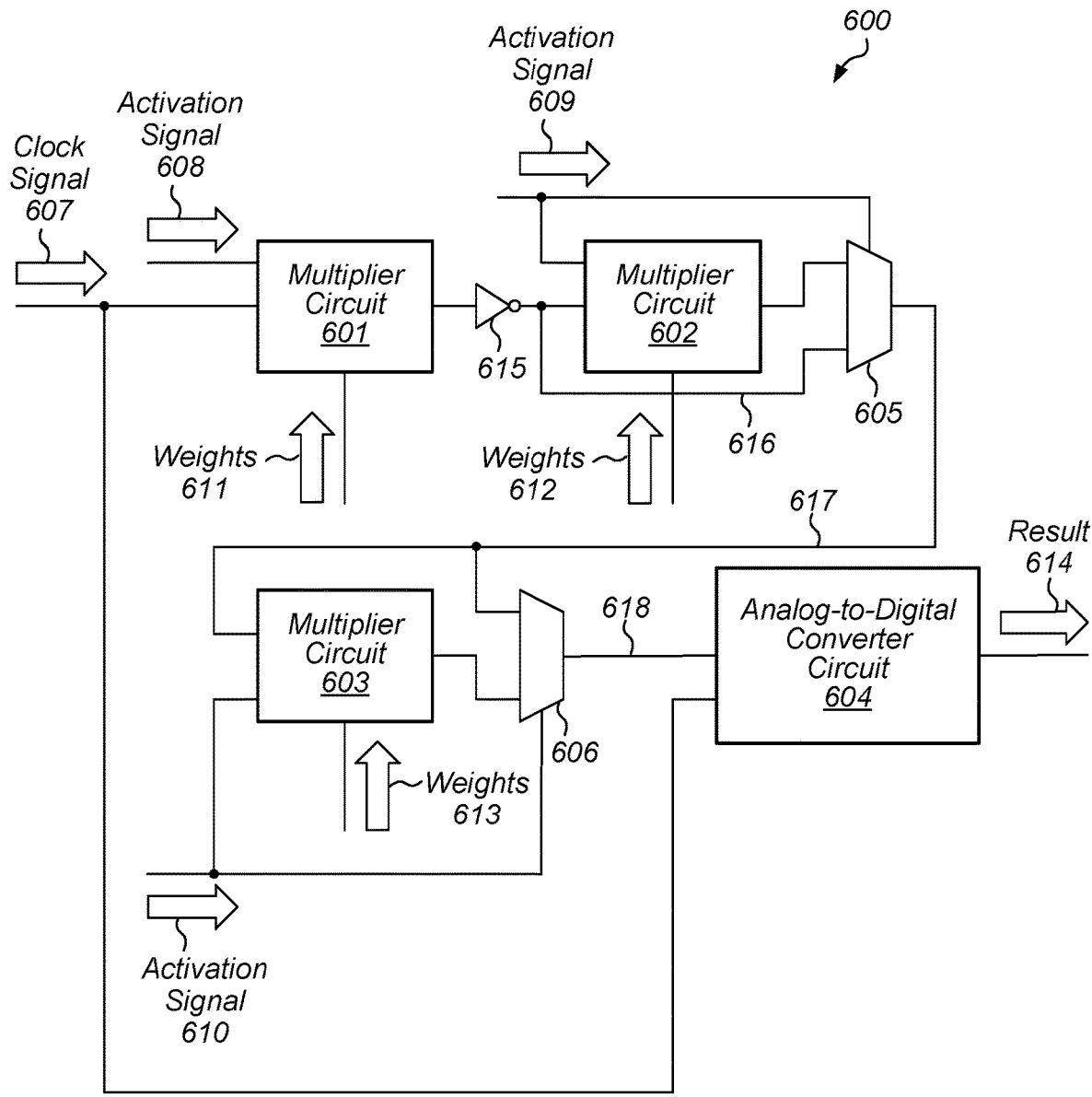
FIG. 6 is a block diagram of an embodiment of a compute-memory circuit employing sequential activation of multiplier circuits.

In addition to activating the multiplier circuits of a compute-memory circuit in parallel, the multiplier circuits may also be activated in a sequential fashion. By activating the circuits sequentially, a spike in power consumption may be avoided, at the expense of additional latency to achieve a result. Turning to FIG. 6, a block diagram of a compute-memory circuit employing sequential activation is depicted. As illustrated, compute-memory circuit 600 includes multiplier circuits 601-604, analog-to-digital converter circuit 604, multiplex circuits 605 and 606, and inverter 615. It is noted that, for clarity, memory array circuits and other control circuits have been omitted.

Multiplier circuit 601 is configured to generate a first partial product using clock signal 607, weights 611, and activation signal 608. Inverter 615 is configured to change the logical polarity of the first partial product, which is coupled to multiplier circuit 602 and multiplex circuit 605 via node 616. Multiplier circuit 602 is configured to generate a second partial product using activation signal 609, weights 612, and the inverted version of the first partial product. Multiplier circuit 603 is configured to generate a third partial product using activation signal 610, weights 613, and an output of multiplex circuit 605 received via node 617.

Multiplex circuit 605 is configured to select either the inverted version of the first partial product or the second partial product based on activation signal 609. Multiplier circuit 603 is configured to generate a third partial product using the output of multiplex circuit 605 and activation signal 610. Multiplex circuit 606 is configured to select either the output of multiplex circuit 605 or the output of multiplex circuit 605 based on activation signal 610.

When activation signal 608 is activated, multiplier circuit 601 generates the first partial product. Multiplex circuits 605 and 606 allows the first partial product generated by multiplier circuit 601 to be fed forward to analog-to-digital converter circuit 604, wherein it is converted to a digital value. Once activation signal 609 is activated, multiplier circuit 602 generates the second partial product. Once the second partial product is generated, multiplex circuits 605 and 606 allow the second partial product to propagate to analog-to-digital converter circuit 604, where is it converted to a digital value. As activation signal 610 is activated, multiplier circuit 603 generates the third partial product, which is propagated to analog-to-digital converter circuit 604 via multiplex circuit 606 and converted to a digital value. Although only three multiplier circuits are depicted in the embodiment of FIG. 6, in other embodiments, any suitable number of multiplier circuits may be employed.

Analog-to-digital converter circuit 604 is configured to regenerate result 614 using the voltage level of node 618 and clock signal 607. In various embodiments, analog-to-digital converter circuit 604 may be implemented using an oscillator-based analog-to-digital conversion circuit. Multiplier circuits 601-604 may be implemented using either of multiplier circuits 200 or 300 as depicted in FIGS. 2 and 3, respectively. Multiplex circuits 605 and 606 may be implemented using multiple pass gates coupled together in a wired-OR fashion or any other suitable circuit capable of selectively coupling two analog inputs signals to an output circuit node.

Figure 7:
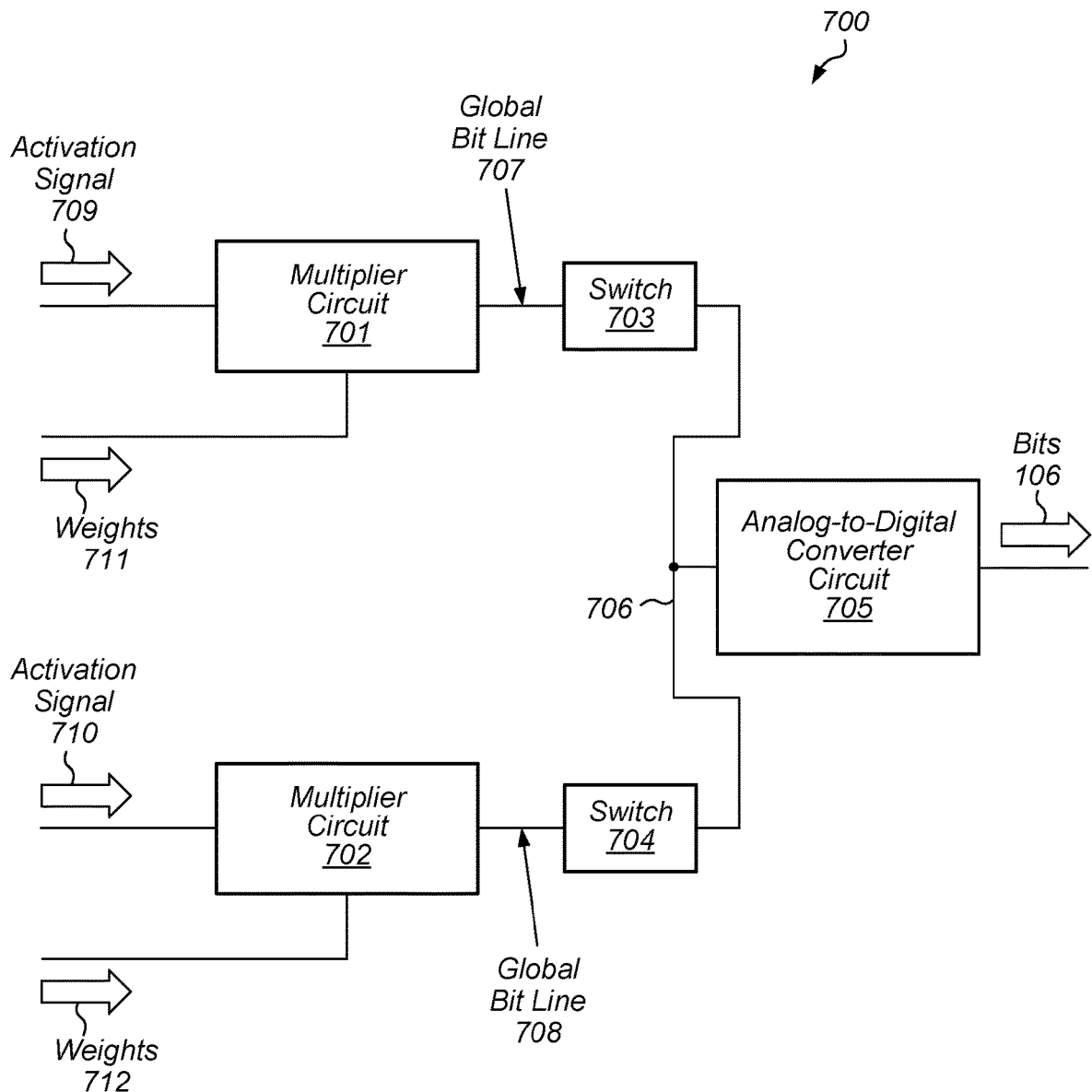
FIG. 7 is a block diagram of an embodiment of a summation circuit using global bit line averaging.

Turning to FIG. 7, a block diagram of an embodiment of a summation circuit using global bit line averaging is depicted. As illustrated, summation circuit 700 includes multiplier circuits 701-702, switches 703-704, and analog-to-digital converter circuits 705.

Multiplier circuit 701 is configured to generate a voltage level on global bit line 707 using activation signal 709 and weights 711. In various embodiments, the voltage level on global bit line 707 may correspond to a product of activation signal 709 and weights 711. In a similar fashion, multiplier circuit 702 is configured to generate a voltage level on global bit line 708, whose value correspond to a product of activation signal 710 and weights 712. In various embodiments, weights 711 and 712 may correspond to weights 103, and activation signals 709 and 710 may be included in activation signals 107A-C. Multiplier circuits 701 and 702 may be implemented as either multiplier circuit 200 or multiplier circuit 300 as depicted in FIG. 2 and FIG. 3, respectively.

Switch 703 is configured to couple global bit line 707 to node 706, while switch 704 is configured to couple global bit line 708 to node 706. When multiplier circuits 701 and 702 are inactive, switches 703 and 704 are open, isolating global bit lines 707 and 708 from node 706. Once multiplier circuit 701 has generated a voltage level on global bit line 707, and multiplier circuit 702 has generated a voltage level on global bit line 708, switches 703 and 704 are closed, coupling global bit lines 707 and 708 to node 706. As global bit lines 707 and 708 are coupled to node 706, respective amounts of charge on global bit lines 707 and 708, combine on node 706, generating a voltage level on node 706 that corresponds to a sum of the products represented by the voltage levels on global bit lines 707 and 708. In various embodiments, switches 703 and 704 may be implemented as p-channel MOSFETs, pass gates, or any other suitable switch circuit configured to couple one circuit node to another.

Analog-to-digital converter circuit 705 is configured to generate bits 106 using a voltage level of node 706. As described above, the voltage level of node 706 corresponds to a sum of partial products generated by multiplier circuits 701 and 702. In various embodiments, analog-to-digital converter circuit 705 may correspond to analog-to-digital converter circuit 104 as depicted in FIG. 1.

In the embodiment of FIG. 7, by performing the addition in the analog domain by combining the partial product voltages generated by multiplier circuits 701 and 702, power consumption of a compute-memory circuit may be reduced by employing less analog-to-digital converter circuits.

Figure 8:
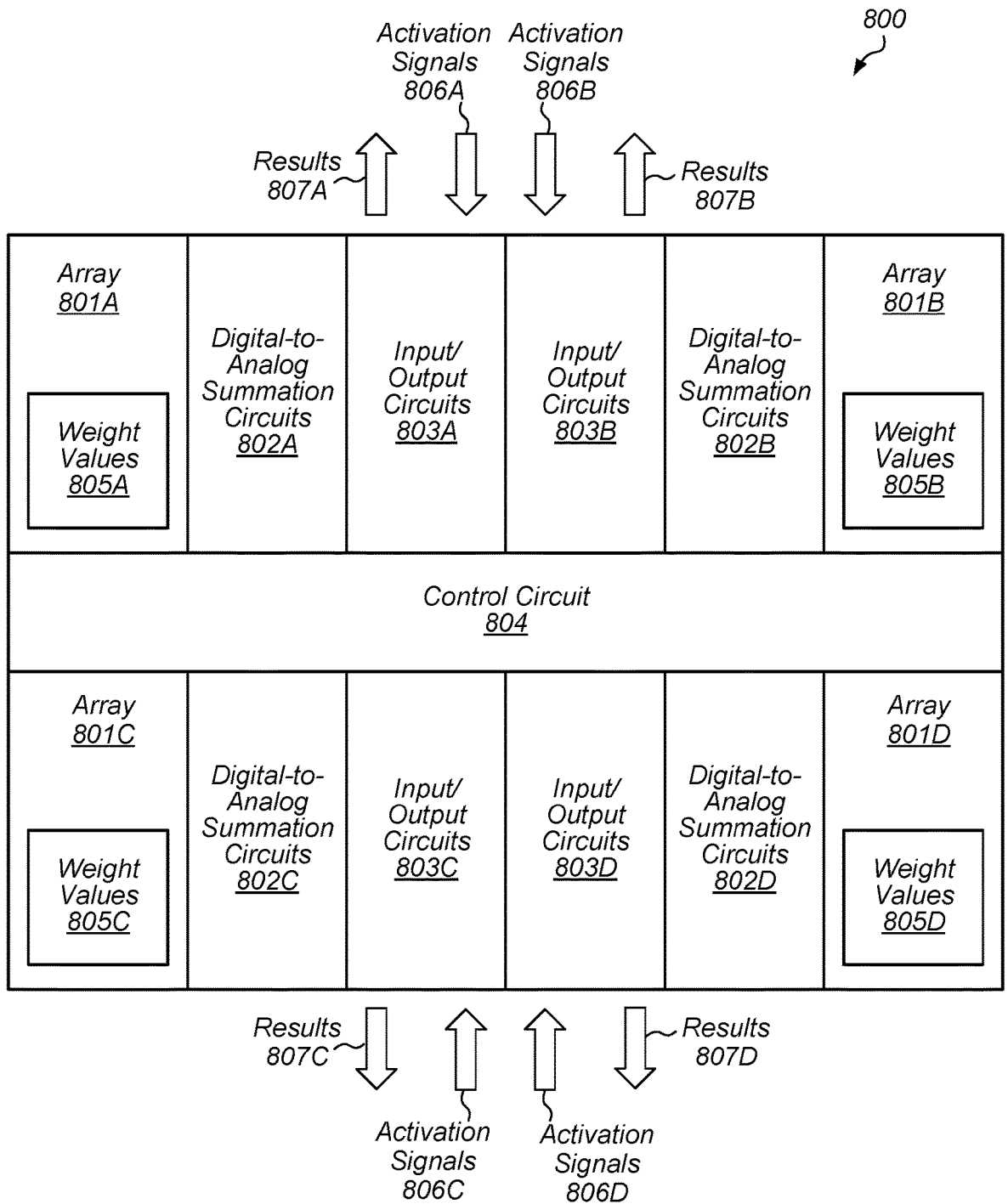
FIG. 8 is a block diagram of an embodiment of a compute-memory circuit with externally supplied activation values.

Turning to FIG. 8, a block diagram of an embodiment of a compute-memory circuit with externally supplied activation values is depicted. As illustrated, compute-memory circuit 800 includes arrays 801A-D, digital-to-analog summation circuits 802A-D, input/output circuits 803A-D, and control circuit 804.

Control circuit 804 is located in a central spine of compute-memory circuit 800. In various embodiments, control circuit 804 may include any suitable combination of logic circuits and sequential logic circuits configured to generate internal timing and control signals for compute-memory circuit 800. In some cases, control circuit 804 may employ a clock signal (not shown) as a timing reference for the generation of the internal timing and control signals.

Arrays 801A-D are configured to store weight values 805A-D, respectively. In some embodiments, arrays 801A-D may each include multiple data storage cells (e.g., SRAM data storage cells) configured to store respective bits of weight values. In some embodiments, values stored in weight values 805A-D may be received via input/output circuits 803A-D and may be stored in corresponding ones of the data storage cells during write operations. During compute operations, particular ones of the multiple data storage cells may be activated in order to retrieve weight values for multiply-and-accumulate operations.

It is noted that arrays 801A-D may be activated independently, allowing for the performance of four different multiply-and-accumulate operations. Although only four arrays are shown in the embodiment of FIG. 8, in other embodiments, any suitable number of arrays may be employed.

Input/Output circuits 803A-D are configured to receive weight data for storage in arrays 801A-D, as well as activation signals for use in multiply-and-accumulate operations. Additionally, input/output circuits 803A-D are also configured to transmit result signals (e.g., result 505), indicative of a product of an activation signal and multiple weight values.

Digital-to-analog summation circuits 802A-D are configured to combine weight values 805A-D with activation signals 806A-D to generate results 807A-D. As described above, results 807A-D may be a product of particular ones of weight values 805A-D with particular ones of activation signals 806A-D. In various embodiments, digital-to-analog summations circuits 802A-D may be implemented using either multiplier circuit 200 or multiplier circuit 300, along with analog-to-digital converter circuit 104.

Figure 9:
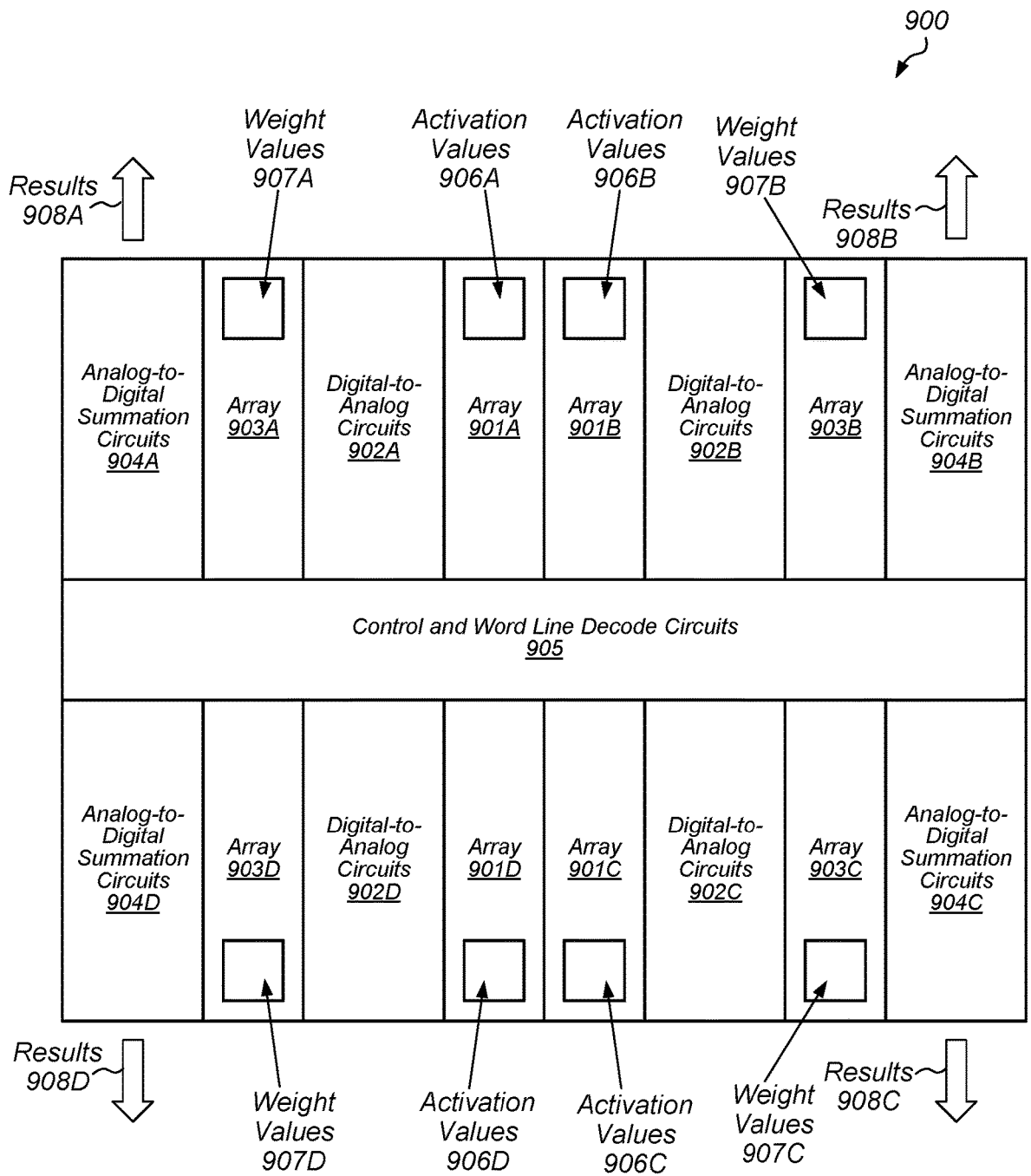
FIG. 9 is a block diagram of an embodiment of a compute-memory circuit with activation values stored in the compute memory-circuit.

Turning to FIG. 9, a block diagram of an embodiment of a compute-memory circuit with internally supplied activation values is depicted. As illustrated, compute-memory circuit 900 includes arrays 901A-D, digital-to-analog circuits 902A-D, arrays 903A-D, analog-to-digital summation circuits 904A-D, and control and word line decode circuits 905.

Arrays 901A-D are configured to store activation values 906A-D, respectively. In some embodiments, arrays 901A-D may each include multiple data storage cells (e.g., SRAM data storage cells) configured to store respective bits of weight values. In some embodiments, values stored in activation values 906A-D may be received via input/output circuits (not shown) and stored in corresponding ones of the data storage cells during write operations. During compute operations, particular ones of the multiple data storage cells may be activated in order to retrieve activation values for multiply-and-accumulate operations.

Digital-to-analog circuits 902A-D are configured to combine weight values 907A-D with activation signals 906A-D to generate partial products using one or more of the circuits and methods described above. In various embodiments, digital-to-analog circuits 902A-D may be implemented using either multiplier circuit 200 or multiplier circuit 300.

Arrays 903A-D are configured to store weight values 907A-D, respectively. In some embodiments, arrays 903A-D may each include multiple data storage cells (e.g., SRAM data storage cells) configured to store respective bits of weight values. In some embodiments, values stored in arrays 903A-D may be received via input/output circuits and stored in corresponding ones of the data storage cells during write operations. During compute operations, particular ones of the multiple data storage cells may be activated in order to retrieve activation values for multiply-and-accumulate operations.

Analog-to-digital summation circuits 904A-D are configured to combine the partial products generated by digital-to-analog circuits 902A-D to generated results 908A-D. In various embodiments, analog-to-digital summation circuits may be implemented using analog-to-digital converter circuit 104 and weighted-summation circuit 503.

Control and word line decode circuits 905 are configured to activate particular rows within arrays 901A-D and 903A-D in order to retrieve activation values 906A-D and weight values 907A-D. In various embodiments, control and word line decode circuits 905 may include counter circuits and decoder circuits used to step through previously stored activation and weight values to generate the desired product. Control and word line decode circuits 905 is also configured to generate internal timing and control signals for compute-memory circuit 900. In some cases, control and word line decode circuits 905 may employ an external clock signal (not shown). In various embodiments, control and word line decode circuits 905 are also configured to control write operations into arrays 901A-D and 903A-D to store activation and weight values, respectively.

Analog-to-digital converter circuits tend not scale with an increase in the resolution of its output. Adding more bits, i.e., increasing the resolution or accuracy of the output of analog-to-digital converter can add area, power, and circuit complexity. Such increases tend to not be linear with the number of bits added to the output of the analog-to-digital converter circuit.

Figure 10:
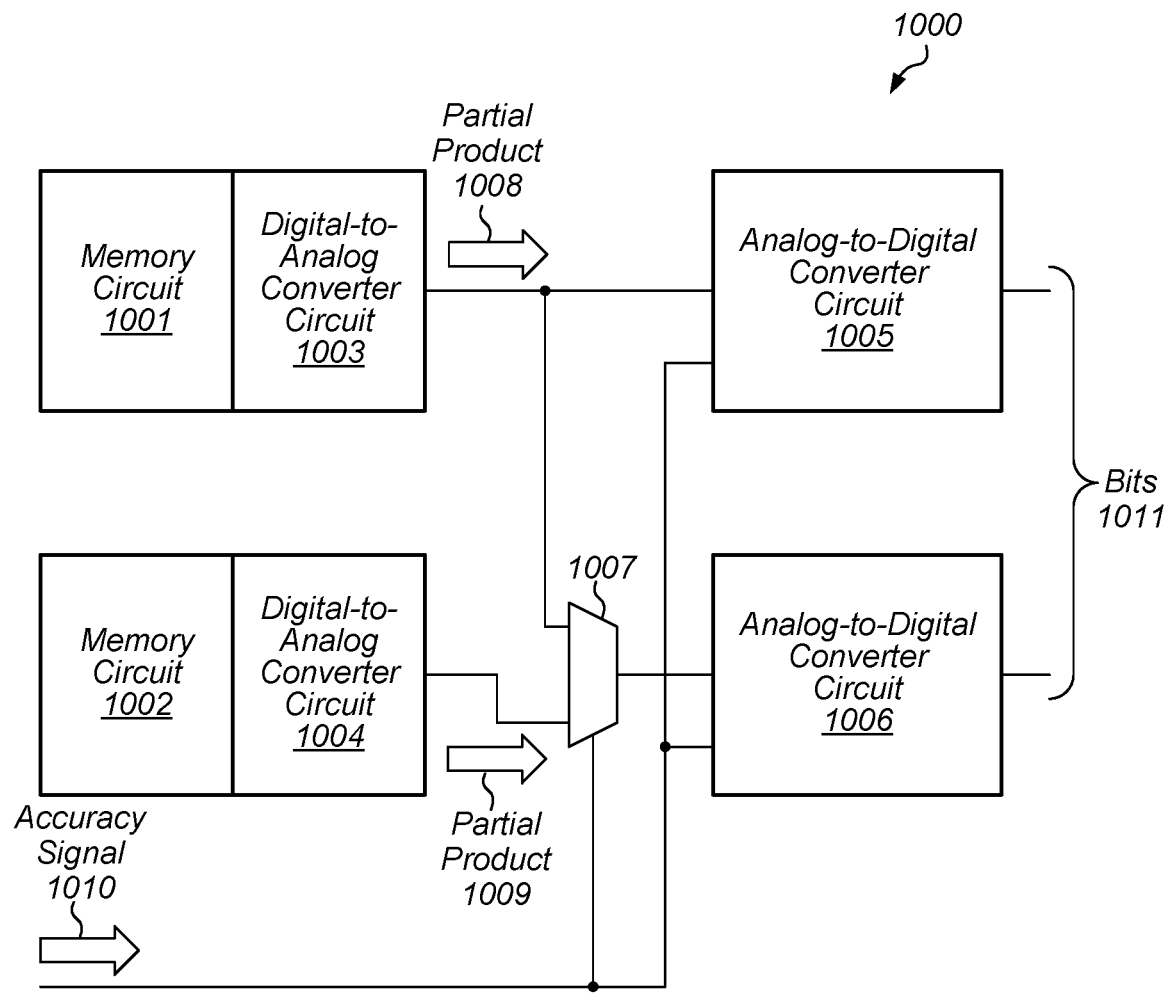
FIG. 10 depicts a flow diagram illustrating an embodiment of a re-configurable analog-to-digital converter circuit system for a compute-memory circuit.

In the case of compute-memory circuits, however, an area efficient solution for increase analog-to-digital resolution may be achieved by trading storage capacity in memory array circuits for the increased resolution. Turning to FIG. 10, an embodiment of a re-configurable analog-to-digital converter system for a compute-memory circuit is depicted. As illustrated, re-configurable system 1000 includes memory circuits 1001-1002, digital-to-analog converter circuits 1003-1004, analog-to-digital converter circuits 1005-1006, and multiplex circuit 1007.

Memory circuits 1001 and 1002 are configured to store weight values, and in some cases activation values. Digital-to-analog converter circuit 1003 is configured to generate partial product 1008, and digital-to-analog converter circuit 1004 is configured to generate partial product 1009. In various embodiments, digital-to-analog converter circuits 1003 and 1004 may correspond to either of multiplier circuits 200 or 300. It is noted that partial products 1008 and 1009 are encoded as respective analog voltage levels.

Analog-to-digital converter circuit 1005 is configured to generate an output using partial product 1008, and during normal operation, analog-to-digital converter circuit 1006 is configured to generate an output using partial product 1009. In various embodiments, analog-to-digital converter circuits 1005 and 1006 may be implemented as successive approximation analog-to-digital converter circuits, flash analog-to-digital converter circuits, or any other suitable type of analog-to-digital converter circuit.

In response to an activation of accuracy signal 1010, multiplex circuit 1007 routes partial product 1008 to analog-to-digital converter circuit 1006, instead of partial product 1009. The activation of accuracy signal 1010 also results in analog-to-digital converter circuits 1005 and 1006 to work in unison to generate bits 1011. In such cases, bits 1011 may include a larger number of bits than either of the outputs generated by analog-to-digital converter circuits 1005 and 1006 when accuracy signal 1010 is de-activated. For example, analog-to-digital converter circuit 1005 may generate a lower word of bits 1011 based on partial product 1009, while analog-to-digital converter circuit 1006 can generate an upper word of bits 1011 based on partial product 1009.

When operating in unison, analog-to-digital converter circuits 1005 and 1006 may share one or more control signals (not shown). In some cases, sub-circuits within analog-to-digital converter circuits 1005 and 1006 may be coupled together. For example, in cases where analog-to-digital converter circuits 1005 and 1006 are implemented as flash analog-to-digital converter circuits, the divider circuits, or portions thereof, may be coupled together to form a common divider circuit employed by both analog-to-digital converter circuits.

While operating with increased accuracy, partial product 1009 is not used, effectively reducing the useful storage capacitor of the system since any weight or activation values stored in memory circuit 1002 cannot be accessed. It is noted that both memory circuit 1002 and digital-to-analog converter circuit 1004 may be placed in a power-off state when operating with increased accuracy.

It is noted that while the embodiment depicted in FIG. 10 provides a dynamic way to generate an output with additional bits, in other embodiments, a compute-memory circuit may be hardwired in such a state. As described below, compiler technology may be employed to generate design data for a compute-memory circuit. When using such compiler technology, multiple analog-to-digital converter circuits may be available in a library of circuits from which a compute-memory circuit may be constructed. The available analog-to-digital converter circuits may be configured to generate different numbers of output bits, and a selection of which analog-to-digital converter circuit to used in a given compute-memory circuit design may be based on target circuit area, target power consumption, or any other suitable design information.

In some cases, an analog-to-digital converter circuit with a desired number of output bits may not be available. Rather than using an analog-to-digital converter circuit with a next higher number of output bits, the compiler technology may allow for using two or more analog-to-digital converter circuits working in unison to achieve a desired number of output bits. In some cases, the analog-to-digital converter circuits selected for use may each generate a common number of output bits, while in other cases, different ones of the selected analog-to-digital converter circuits may generate different numbers of output bits.

In some compute-memory circuits, to perform a complete convolution operation, the re-arrangement of weight values within an array may be necessary. Such movement of weight values involves reading the weight values from a memory array circuit included in a compute-memory circuit and re-writing the weight values to the memory array circuits at different storage locations. Moving the weight values in this fashion increases power consumption of the compute-memory. Techniques described in the present disclosure allowing for generating partial product values relying on the local storage of weight values to avoid weight value movement and reduce power consumption.

Figure 11:
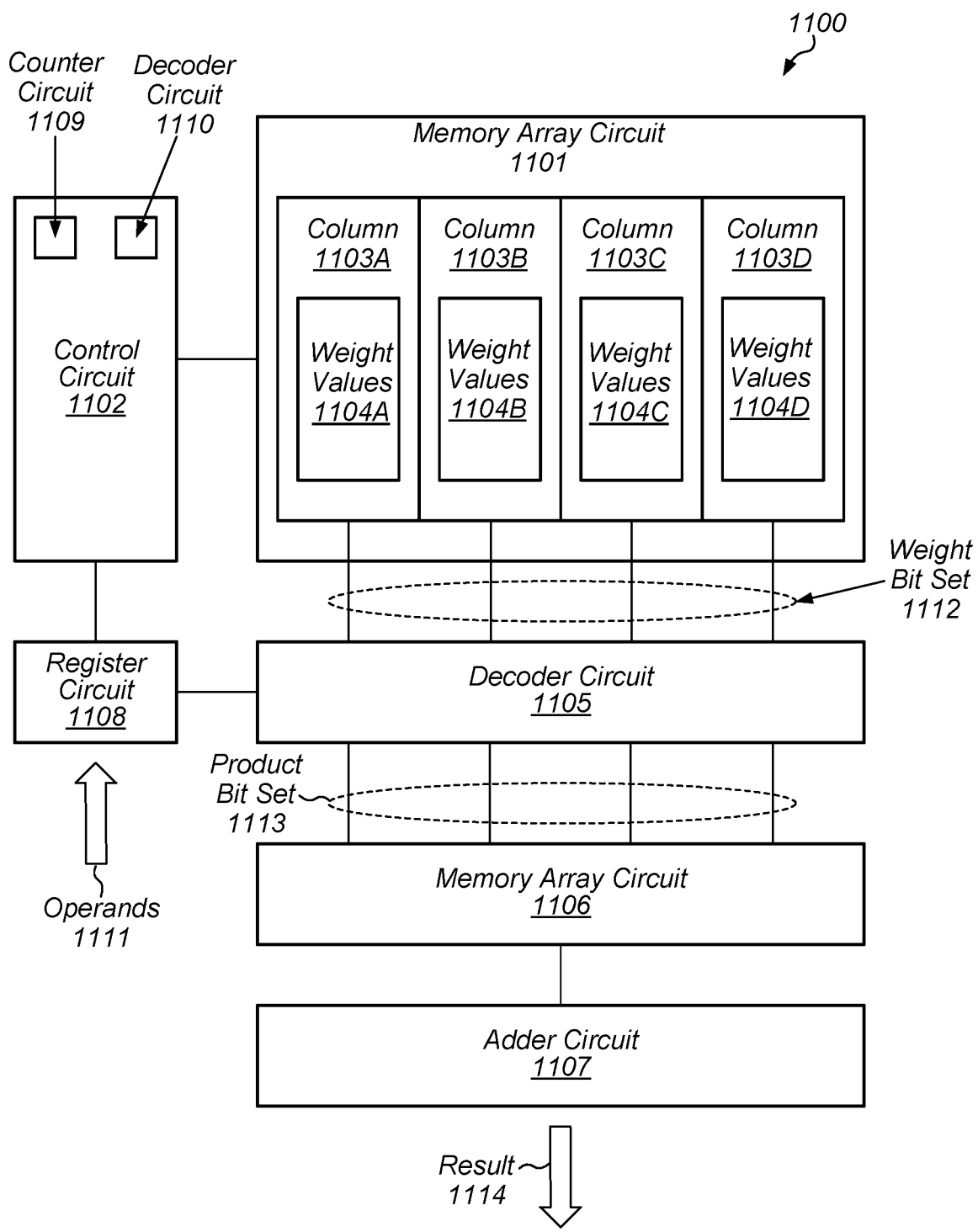
FIG. 11 is a block diagram of another embodiment of a compute-memory circuit.

Turning to FIG. 11, a block diagram of an embodiment of a compute-memory circuit is depicted. As illustrated, compute-memory circuit 1100 includes memory array circuit 1101, control circuit 1102, decoder circuit 1105, memory array circuit 1106, adder circuit 1107, and register circuit 1108.

Memory array circuit 1101 include columns 1103A-D that are configured to store weight values 1104A-D respectively. Weight values 1104A-D include respective weight bits. Each of weight values 1104A-D may include any suitable number of weight bits. As described below, columns 1103A-D may include respective pluralities of data storage cells. Individual weight bits of a given weight value are stored in corresponding data storage cells included in a column corresponding to the given weight value. Although only four columns are depicted in the embodiment of FIG. 11, in other embodiments, any suitable number of columns may be employed. In some cases, the number of columns may correspond to a number of weight and operand values that are used in a convolution operation.

Control circuit 1102 is configured to perform a multiplication operation that includes a plurality of cycles. To perform a given cycle of the plurality of cycles, control circuit 1102 is further configured to retrieve weight bits set 1112 from columns 1103A-D. In various embodiments, control circuit 1102 may include any suitable combination of combinatorial logic gates along with a state machine or other sequential logic circuit.

In various embodiments, control circuit 1102 includes counter circuit 1109 configured to generate a plurality of count values. Control circuit 1102 may be further configured to activate, during a given cycle, a common word line coupled to a data storage cell in each of columns 1103A-D. Control circuit 1103 can additionally include decoder circuit 1105 that is configured to decode the count values in order to activate word lines in memory array circuit 1101.

Decoder circuit 1105 is configured, during the given cycle, to combine weight bit set with corresponding operand bits from respective ones of a plurality of operands to generate a given product bit set 1113. In various embodiments, decoder circuit 1105 is configured to receive the operand bits from register circuit 1108. During each cycle, decoder circuit 1105 is configured to generate another product bit set, resulting in multiple product bit sets that are stored in memory array circuit 1106. As described below, decoder circuit 1105 may be implemented using multiple pass-gate structures.

Register circuit 1108 is configured to store a first plurality of operand bits corresponding to a first bit position in operands 1111. For example, during an initial cycle of the plurality of cycles, a bit from the first bit position of each operand in operand 1111 may be stored in register circuit 1108. In response to a determination that a particular number of cycles has completed, register circuit 1108 is further configured to replace the first plurality of operand bits with a second plurality of operand bits corresponding to a second position in operands 1111. For example, after control circuit 1102 has sequentially activated each of the word lines associated with all of the weight bits included in weight values 1104A-D, register circuit 1108 may load bits from a next bit position in each operand in operands 1111 so that the next set of bits in operands 1111 can be multiplied by the various weight bits as the cycles continue. In various embodiments, register circuit 1108 may be implemented using multiple latch circuits, flip-flop circuits, or any other suitable storage circuits.

Memory array circuit 1106 is configured to store the product bits sets generated by decoder circuit 1105. In various embodiments, memory array circuit 1106 is configured, in response to a determination that the multiplication operation has completed, to perform a transpose operation on the stored plurality of product bit sets. The transpose operation may re-arrange data within memory array circuit 1106 to allow adder circuit 1107 to retrieve all of the product bits for a given weight value of weight values 1104A-D in a single read operation. In various embodiments, memory array circuit 1106 may include multiple data storage cells configured to perform the transpose operation. For example, memory array circuit 1106 may be implemented using 10-transistor SRAM data storage cells.

Adder circuit 1107 is configured, in response to a determination that the multiplication operation has completed, to combine the plurality of product bit sets to generate result 1114. To generate result 1114, adder circuit 1107 may be further configured to retrieve product bit sets stored in memory array circuit 1106. In various embodiments, adder circuit 1107 may be implemented using multiple instances of full-adder or half-adder logic circuits or any other suitable combination of combinatorial logic circuits.

Figure 12:
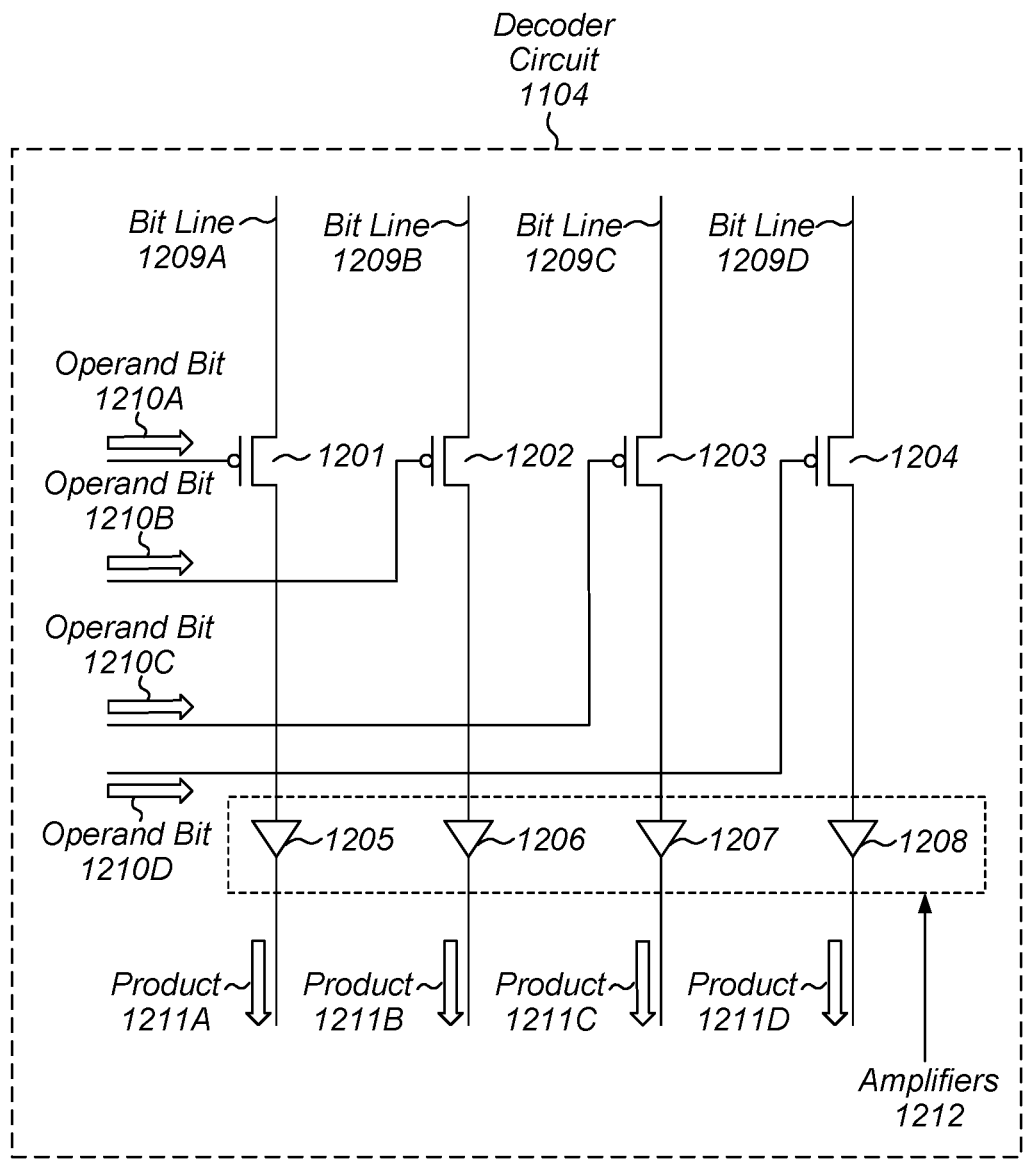
FIG. 12 is a block diagram of an embodiment of a decoder circuit for use in a compute-memory circuit.

Turning to FIG. 12, an embodiment of decoder circuit 1104 is depicted. As illustrated, decoder circuit 1104 includes devices 1201-1204 and amplifiers 1212, which include amplifier circuits 1205-1208. Although only four devices and four amplifier circuits are depicted, in other embodiments, different numbers of devices and amplifier circuits may be employed based on a number of columns included in memory array circuit 1101.

Device 1201 is coupled between bit line 1209A and amplifier circuit 1205, and device 1202 is coupled between bit line 1209B and amplifier circuit 1206. In a similar fashion, device 1203 is coupled between bit line 1209C and amplifier circuit 1207, and device 1204 is coupled between bit line 1209D and amplifier circuit 1208. Device 1201 is controlled by operand bit 1210A, and device 1202 is controlled by operand bit 1210B. In a similar fashion, device 1203 is controlled by operand bit 1210C, and device 1204 is controlled by operand bit 1210D. In various embodiments, operand bits 1210A-C may be included in operand 1111.

Each of devices 1201-1204 is configured to perform a binary multiplication of a value on a corresponding one of bit lines 1209A-D, and a value of a corresponding one of operand bits 1210A-D. Amplifier circuits 1205-1208 are configured to generate products 1211A-D using respective outputs of devices 1201-1204. For example, device 1201 generates a product of a value of bit line 1209A and operand bit 1210A on an input of amplifier circuit 1205, which generates product 1211A. The binary multiplication operation results from device 1201 only being enabled when the value of operand bit 1210A is a logical-0, allowing the value of bit line 1209A to propagate to the input of amplifier circuit 1205. When the value of operand bit 1210A is a logical-1, device 1201 is disabled and the input of amplifier circuit 1205 remains at a pre-charge level, which may correspond to a product of zero.

In various embodiments, bit lines 1209A-D are coupled to data storage cells (also referred to as "bit cells") included in columns 1103A-D as depicted in FIG. 11. Although bit lines 1209A-D are depicted as being single lines, in some embodiments, bit lines 1209A-D may be implemented as respective pairs of wires. In such cases, retrieved weights 1110 may be differentially encoded on the pairs of wires.

In various embodiments, devices 1201-1204 may be implemented as p-channel MOSFETs or any other suitable transconductance devices. Moreover, amplifier circuits 1205-1208 may be referred to as "sense amplifiers" and may, in some embodiments, be implemented as CMOS inverters or other suitable single-ended amplifier circuits. It is noted that in cases where information is differentially encoded on the bit lines, additional devices may be employed, and amplifier circuits 1205-1208 may be implemented using differential amplifier circuits.

Figure 13:
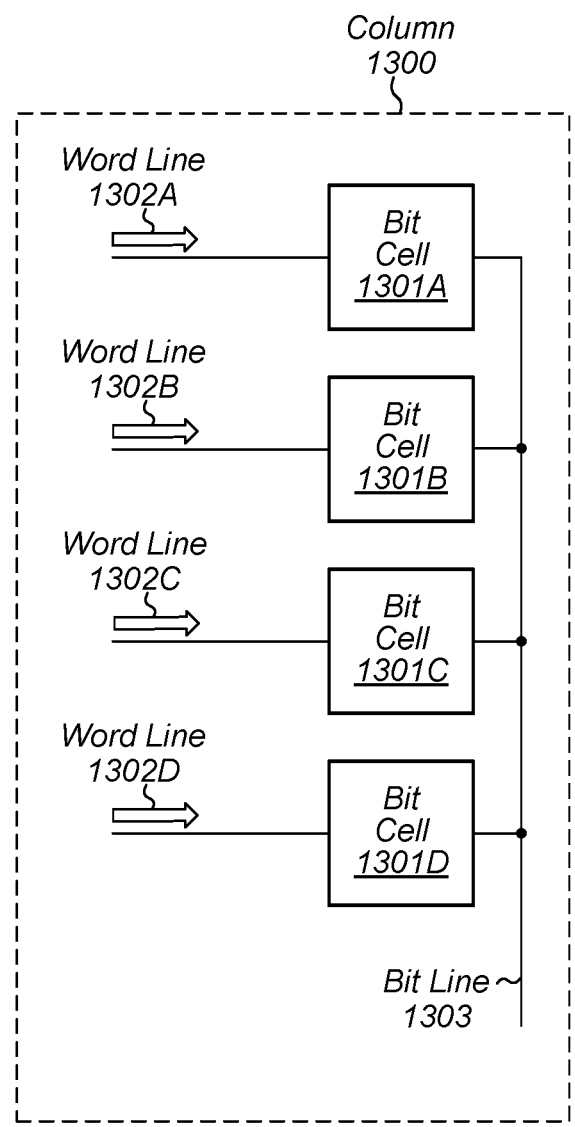
FIG. 13 is a block diagram of an embodiment of a column included in a memory array circuit of a compute-memory circuit.

Turning to FIG. 13, an embodiment of a column circuit is depicted. As illustrated, column 1300 includes bit cells 1301A-D. In various embodiments, column 1300 may correspond to any of columns 1103A-D as depicted in FIG. 11.

Bit cells 1301A-D are configured to store respective bits of a particular one of weight values 1109A-D and are coupled to bit line 1303. Bit cell 1301A is further coupled to word line 1302A and bit cell 1301B is further coupled to word line 1302B. In a similar fashion, bit cells 1301C and 1301D are further coupled to word lines 1302C and 1302D, respectively.

In response to an assertion of a particular one of word lines 1302A-D, a corresponding one of bit cells 1301A-D is activated. For example, in response to an assertion of word line 1302A, bit cell 1301 is activated, causing bit cell 1301 to generate a change in the voltage level of bit line 1303 indicative of a logic value stored in bit cell 1301A. In some cases, the change in voltage level of bit line 1303 may be a drop in voltage from a pre-charge level, while in other cases, there may be no change from the pre-charge level of bit line 1303.

Each of bit cells 1301A-D may be implemented according to various data storage cell circuits. For example, in some embodiments, bit cells 1301A-D may be 6-transistor SRAM bit cells or another suitable data storage cell circuit configured to store information indicative of a logic value.

As described above, compute-memory circuit 1100 employs multiple cycles in order to create a complete multiply-and-accumulate operation. A chart depicting how different partial products are created during each cycle is depicted in FIG. 14, which illustrates the multiplication of 4-bit operands (denoted as "x") with 4-bit weights (denoted as "w"). It is noted, that in cases where different numbers of bits are included in the operand and weights, the number of cycles will be different.

In cycle 0, bits 0-3 of the first operand x0 are combined with bits in bit position 0 of the weights 0-3, respectively, to generate a first set of partial products. Once the first set of partial products is shifted out of register circuit 1108, the next set of partial products can be generated. In cycle 1, bits 0-3 of x0 are combined with bits in first bit position of weights 0-3, to generate a second set of partial products.

In a similar fashion, bits 0-3 of x0 are combined with bits in a second bit position of weights 0-3 in cycle 2, to generate a third set of partial products. In cycle 3, bits 0-3 of x0 are combined with bits in bit position 3 of weights 0-3 to generate a fourth set of partial products. Once the four cycles have been completed, the partial products from the four cycles can be added to form a final result.

In this example, there are 4-bits included in both the operands and weights, so once four cycles have been completed, a complete set of partial products have been generated. Starting with the cycle 4, a second operand x1 is used to generate the next set of partial product generation, in a similar fashion to what is described above. It is noted that the chart of FIG. 14 depicts one method of combining the operand and weight bits over multiple cycles. In other embodiments, different order of the cycles may be employed.

Figure 15:
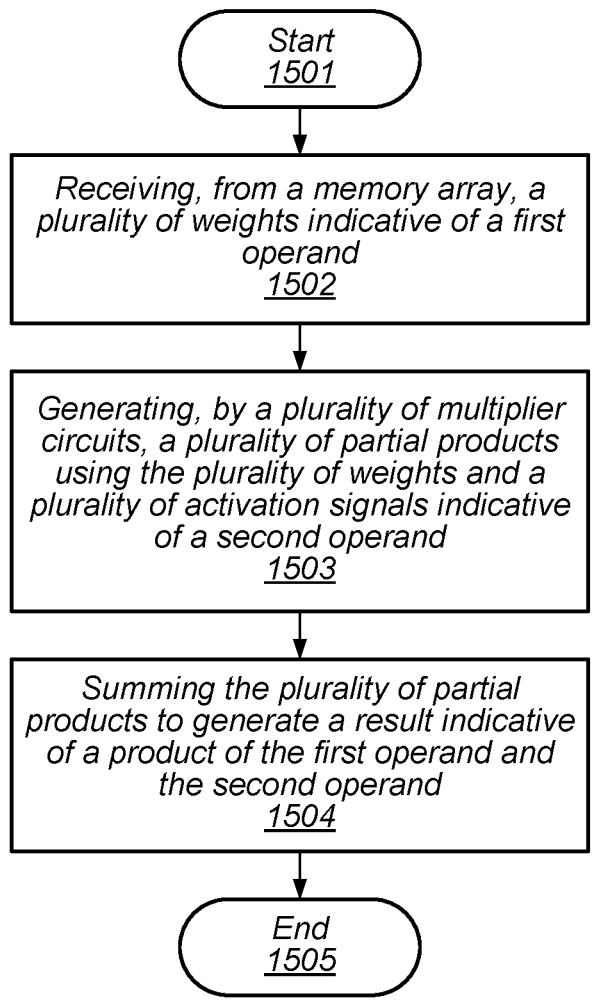
FIG. 15 is a flow diagram depicting an embodiment of a method for operating a compute-memory circuit.

Turning to FIG. 15, a flow diagram depicting an embodiment of a method for operating a compute memory is illustrated. The method, which begins in block 1501, may be applied to various compute-memory circuits such as compute-memory circuit 100 as depicted in FIG. 1.

The method includes receiving, from a memory array, a plurality of weights indicative of a first operand (block 1502). In various embodiments, the memory array includes a plurality of data storage cells that may be implemented as static random-access memory (SRAM) data storage cells, dynamic random-access memory (DRAM) data storage cells, non-volatile data storage cells, or any other suitable type of data storage cells.

The method further includes generating, by a plurality of multiplier circuits, a plurality of partial products using the plurality of weights and a plurality of activation signals indicative of a second operand (block 1503). As described above, the plurality of multiplier circuits may perform a digital-to-analog conversion function and may be implemented according to various circuit topologies. In some cases, the plurality of multiplier circuits may include respective device stacks. In such cases, the method may also include pre-charging a global bit line coupled to the plurality of multiplier circuits, and selecting, using the plurality of weights, one or more of the device stacks included in a particular multiplier circuit. The method may further include discharging the global bit line using the one or more device stacks.

In other embodiments, the multiplier circuits may include capacitor-based digital-to-analog converter elements. In such cases, the method may include pre-charging a global bit line coupled to the plurality of multiplier circuits and selecting, using the plurality of weights, one or more capacitors of a plurality of capacitors included in a particular multiplier circuit. The method may further include modifying an amount of charge stored on the global bit line using the one or more capacitors and a particular one of the plurality of activation signals.

As described above, the plurality of multiplier circuits may be activated in different fashions. In some embodiments, the method may include activating a first multiplier circuit of the plurality of multiplier circuits using a first activation signal of the plurality of activation signals, and activating a second multiplier circuit of the plurality of multiplier circuits using a second activation signal of the plurality of activation signals and an output of the first multiplier circuit.

In other embodiments, different ones of the plurality of multiplier circuits are coupled to corresponding global bit lines. In such cases, generating the plurality of partial products may include generating, by a first multiplier circuit of the plurality of multiplier circuits, a first voltage on a first global bit line, and generating, by a second multiplier circuit of the plurality of multiplier circuits, a second voltage on a second global bit line. The method may further include generating a composite voltage by coupling the first global bit line and the second global bit line to an input of an analog-to-digital converter circuit, and generating a plurality of bits by the analog-to-digital converter circuit using the composite voltage, where the plurality of bits corresponds to the product of the first operand and the second operand.

In some embodiments, modifying the amount of charge stored on the global bit line may include increasing the amount of charge stored on the global bit line using the one or more capacitors and the particular one of the plurality of activation signals. In other embodiments, modifying the amount of charge stored on the global bit line may include decreasing the amount of charge stored on the global bit line using the one or more capacitors and the particular one of the plurality of activation signals.

The method also includes summing the plurality of partial products to generate a result indicative of a product of the first operand and the second operand (block 1504). As described above, the plurality of multiplier circuits may generate corresponding ones of a plurality of voltage levels that represent the plurality of partial products. In such cases, the method may further include converting the plurality of voltage levels to corresponding digital words of a plurality of digital words and summing, using a weighted summer circuit, the plurality of digital words to generate the result. The method concludes in block 1505.

Figure 16:
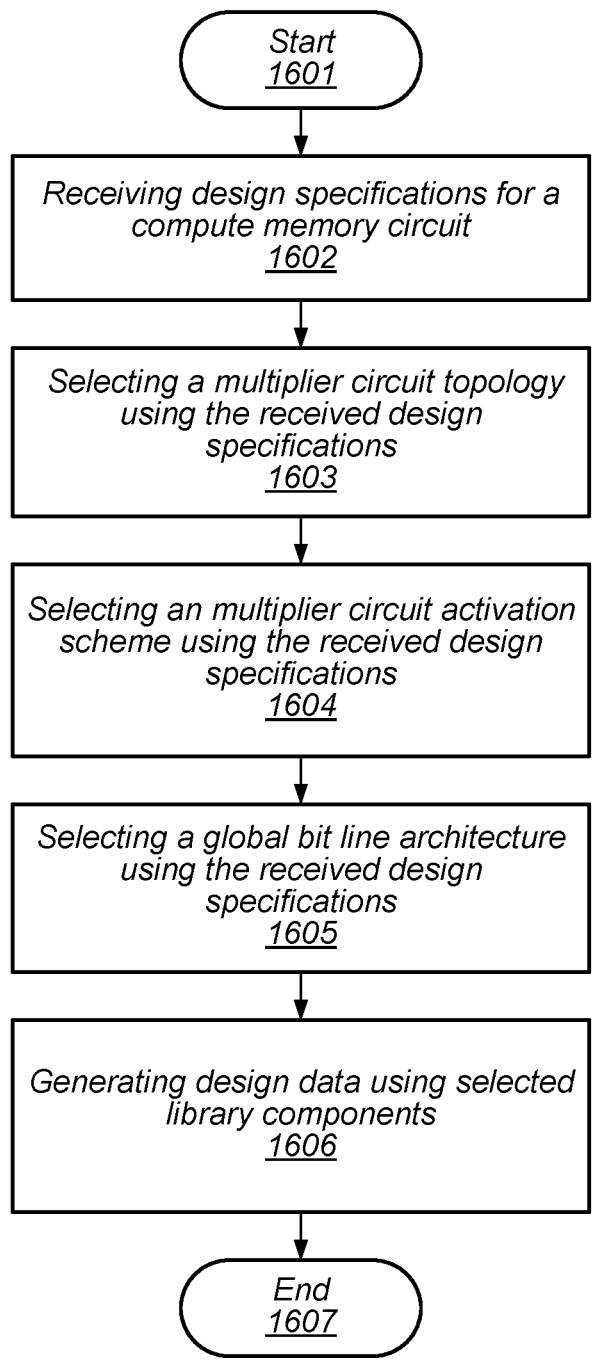
FIG. 16 is a flow diagram depicting an embodiment of a method for compiling a compute-memory circuit.

In some cases, the circuits described above that are included in various embodiments of a compute-memory circuit may be included in a circuit library suitable for memory compilation, where a design for a compute-memory circuit is generated by one or more processor circuits executing program or software instructions stored in a non-transient computer-accessible storage medium. A flow diagram depicting an embodiment of a method for employing such a circuit library is illustrated in FIG. 16. The method, which begins in block 1601, may be used to compile various compute memory circuits such as compute-memory circuits 800 and 900 as illustrated in FIG. 8 and FIG. 9, respectively.

The method includes receiving design specifications for a compute memory circuit (block 1602). In various embodiments, the design specifications may include information specifying respective numbers of bits that will be included in the operands. Additionally, the design specification may include target power consumption, target operating frequency, target circuit area, and the like.

The method also includes selecting a multiplier circuit topology using the received design specifications (block 1603). Two different circuit topologies for a multiplier circuit are described above. In various embodiments, the different circuit topologies physically differ in size and the choice of which circuit topology to employ may be influenced by target area for the compute-memory circuit. Additionally, the different circuit topologies can produce results with different latencies. In such cases, the selection of the multiplier circuit topology may be based on a target performance included in the design specifications.

The method further includes selecting a multiplier circuit activation scheme using the received design specifications (block 1604). As described above, the multiplier circuits may be activated in parallel, in series, or some combination thereof. Activating the multiplier circuits in parallel may cause a spike in power consumption, while activating them in series can result in the power consumption being distributed over a longer period of time. The choice of which activation scheme to be employed may be based on a target power consumption included in the design specifications.

The method also includes selecting a global bit line architecture using the received design specifications (block 1605). As described above, different arrangements of multiplier circuits and global bit lines are possible. In some cases, the different global bit line architectures may have different operating frequencies, power consumptions, and circuit area. In various embodiments, the method may include selecting a particular one of the different global bit line architectures based on a specified combination of power consumption and operating frequency.

The method further includes generating design data using selected library components (block 1606). In various embodiments, design data may be specified using any of various appropriate computer languages, including hardware description languages such as, without limitation: VHDL, Verilog, SystemC, System Verilog, RHDL, M, MyHDL, etc. Design data may be usable by a semiconductor fabrication system to fabricate at least a portion of a compute-memory circuit. The format of the design data may be recognized by at least one semiconductor fabrication system. In some embodiments, such design information may include a netlist that specifies elements of a cell library, as well as their connectivity. One or more cell libraries used during synthesis of a compute-memory circuit may also be included in the design data. Such cell libraries may include information indicative of a device or transistor level netlists, mask design data, characterization data, and the like, of cells included in the cell library. The method concludes in block 1607.

Once the design data is generated, it may be integrated into an overall design for an integrated circuit. As part of the integration process, the design data may be subject to various checks to verify design specifications are met. In cases where design specifications are not met, the method depicted in the flow diagram of FIG. 16 may be repeated using constraints to further refine the various selection operations.

Figure 17:
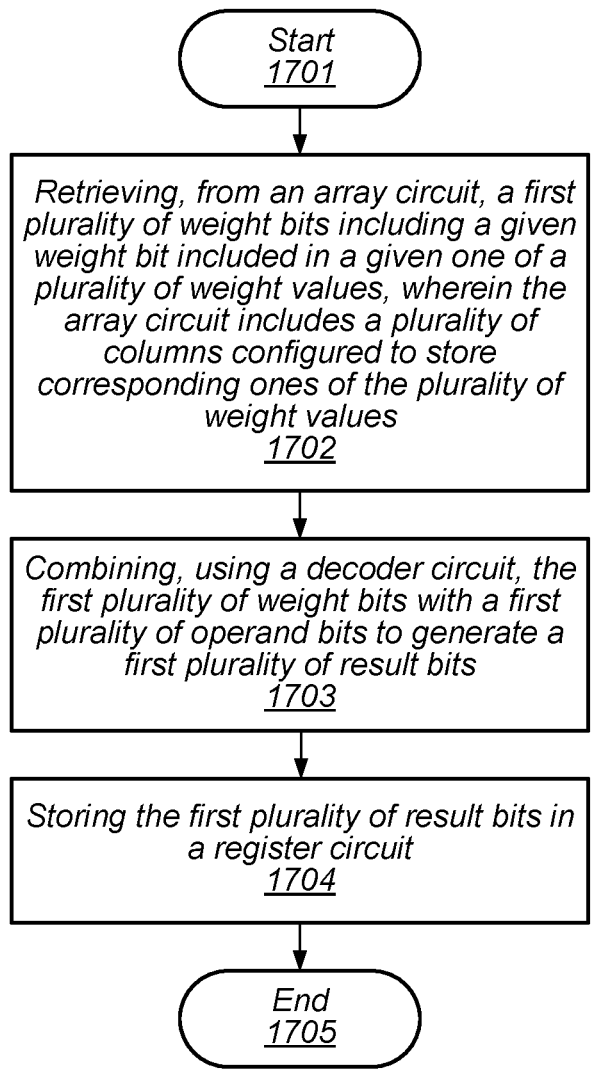
FIG. 17 is a flow diagram depicting an embodiment of another memory for operating a compute-memory circuit.

Turning to FIG. 17, a flow diagram depicting an embodiment of a method for operating a compute memory is illustrated. The method, which begins in block 1701, may be applied to various compute-memory circuits, such as compute-memory circuit 1100 as illustrated in FIG. 11.

The method includes retrieving, from an array circuit, a first plurality of weight bits including a given weight bit included in a given one of a plurality of weight values, wherein the array circuit includes a plurality of columns configured to store corresponding ones of the plurality of weight values (block 1702).

The method further includes combining, using a decoder circuit, the first plurality of weight bits with a first plurality of operand bits to generate a first plurality of results bits (block 1703). In various embodiments, combining the first plurality of weight bits with the first plurality of operand bits includes multiplying a given one of the first plurality of weight bits with a corresponding one of the first plurality of operand bits.

Once result bits have been generated for all of the weight bits associated with the plurality of weight values, a new operand may be used and the process of calculating results bits may be repeated. In such cases, the method includes, loading a second plurality of operand bits into the input register, in response to determining a number of cycles have been completed. In various embodiment, the number of cycles may correspond to a number of bits included in a particular one of the plurality of weight values.

The method may also include retrieving, from the array circuit, a second plurality of weights bits and combining, using the decoder circuit the second plurality of weight bits with the first plurality of operand values to generate a second plurality of results bits.

The method also includes storing the first plurality of result bits in a register circuit (block 1704). In various embodiments, the method further includes shifting, by the register circuit, the first plurality of result bits. In some cases, a number of bits by which the first plurality of result bits is shifted is based on a number of bits included in the first plurality of result bits. The method may also include storing the second plurality of results bits in response to completing the shifting of the first plurality of result bits. The method concludes in block 1705.

Figure 18:
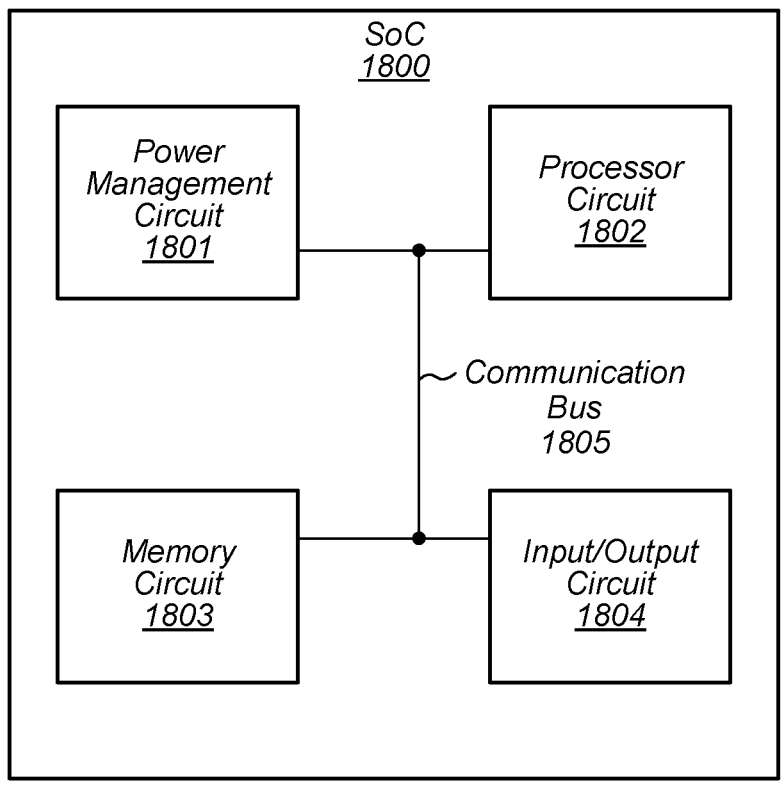
FIG. 18 is a block diagram of an embodiment of a system-on-a-chip.

A block diagram of system-on-a-chip (SoC) is illustrated in FIG. 18. In the illustrated embodiment, the SoC 1800 includes power management unit 1801, processor circuit 1802, memory circuit 1803, and input/output circuits 1804, each of which is coupled to communication bus 1805. In various embodiments, SoC 1800 may be a system-on-a-chip (SoC) and/or may be configured for use in a desktop computer, server, or in a mobile computing application such as, e.g., a tablet, laptop computer, or wearable computing device.

Power management unit 1801 is configured to provide power to processor circuit 1802, memory circuit 1803, and input/output circuits 1804. In various embodiments, power management unit 1801 includes one or more power converter or voltage regulation circuits configured to generate regulated voltage levels on power supply nodes internal to SoC 1800. In some cases, power management unit 1801 may generate respective regulated voltage levels for processor circuit 1802, memory circuit 1803, and input/output circuits 1804.

Processor circuit 1802 may, in various embodiments, be representative of a general-purpose processor that performs computational operations. For example, processor circuit 1802 may be a central processing unit (CPU), a graphics processing unit (GPU), a microcontroller, or the like, implemented as an application-specific integrated circuit (ASIC), or a field-programmable gate array (FPGA), etc. In some embodiments, processor circuit 1802 may interface to memory circuit 1803, power management unit 1801, and input/output circuits 1804 via communication bus 1805.

Memory circuit 1803 may correspond to either of compute-memory circuits 100 or 1100. In various embodiments, memory circuit 1803 may be configured to store weight values which may be used in conjunction with operand values to perform a multiply-and-accumulate or other suitable operation. Memory circuit 1803 may, in various embodiments, include static random-access memory (SRAM) data storage cells, or any other suitable data storage cell.

Input/output circuits 1804 may be configured to coordinate data transfer between SoC 1800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1804 may be configured to implement a version of Universal Serial Bus (USB) protocol or IEEE 1394 (Firewire®) protocol.

Input/output circuits 1804 may also be configured to coordinate data transfer between SoC 1800 and one or more devices (e.g., other computing systems or integrated circuits) coupled to SoC 1800 via a network. In one embodiment, input/output circuits 1804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1804 may be configured to implement multiple discrete network interface ports.

Figure 19:
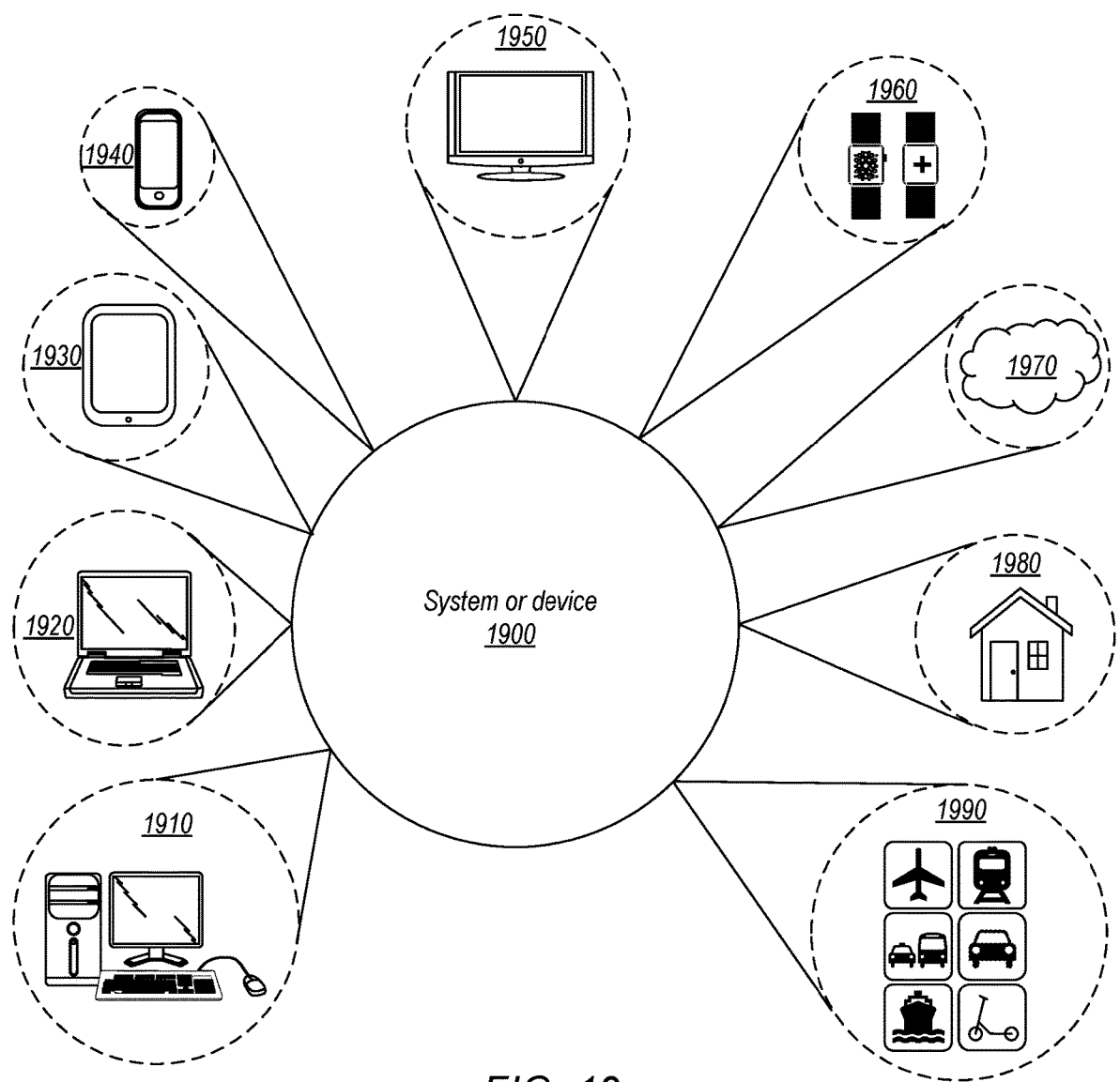
FIG. 19 is a block diagram of an embodiment of a system.

Turning now to FIG. 19, various types of systems that may include any of the circuits, devices, or systems discussed above are illustrated. System or device 1900, which may incorporate or otherwise utilize one or more of the techniques described herein, may be utilized in a wide range of areas. For example, system or device 1900 may be utilized as part of the hardware of systems such as a desktop computer 1910, laptop computer 1920, tablet computer 1930, cellular or mobile phone 1940, or television 1950 (or set-top box coupled to a television).

Similarly, disclosed elements may be utilized in a wearable device 1960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1900 may also be used in various other contexts. For example, system or device 1900 may be utilized in the context of a server computer system, such as a dedicated server or on shared hardware that implements a cloud-based service 1970. Still further, system or device 1900 may be implemented in a wide range of specialized everyday devices, including devices 1980 commonly found in the home such as refrigerators, thermostats, security cameras, etc. The interconnection of such devices is often referred to as the "Internet of Things" (IOT). Elements may also be implemented in various modes of transportation. For example, system or device 1900 could be employed in the control systems, guidance systems, entertainment systems, etc. of various types of vehicles 1990.

The applications illustrated in FIG. 19 are merely exemplary and are not intended to limit the potential future applications of disclosed systems or devices. Other example applications include, without limitation: portable gaming devices, music players, data storage devices, unmanned aerial vehicles, etc.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
    a first memory array circuit including a plurality of columns, wherein a given column of the plurality of columns is configured to store a respective weight value of a plurality of weight values, and wherein the respective weight value includes a plurality of weight bits;
    a control circuit configured to perform a multiplication operation across a plurality of cycles, wherein to perform a given cycle of the plurality of cycles, the control circuit is configured to retrieve a weight bit from respective columns of the plurality of columns to form a set of weight bits, the weight bit being of a respective one of the plurality of weight values;
    a decoder circuit configured to, during the given cycle, combine, for each weight bit of the set of weight bits, that weight bit with an operand bit, from one of a plurality of operands that corresponds to a weight value that includes that weight bit, to generate a portion of a given product bit set of a plurality of product bit sets; and
    an adder circuit configured, in response to a determination that the multiplication operation has completed, to combine the plurality of product bit sets to generate a result.

2. The apparatus of claim 1, further comprising a second memory array circuit configured to:
    store the plurality of product bit sets; and
    in response to a determination that the multiplication operation has completed, perform a transpose operation on the stored plurality of product bits sets.

3. The apparatus of claim 1, further comprising an input register configured to:

store a first plurality of operand bits corresponding to a first bit position in the plurality of operands; and in response to a determination that a particular number of cycles has completed, replace the first plurality of operand bits with a second plurality of operand bits corresponding to a second bit position in the plurality of operands.

4. The apparatus of claim 3, wherein the particular number of cycles corresponds to a number of bits included in a given weight value, and wherein a total number of cycles of the multiplication operation corresponds to a product of the number of bits included in the given weight value and a number of bits included in a given operand.

5. The apparatus of claim 1, wherein a given column of the plurality of columns includes a plurality of data storage cells coupled to respective word lines, and wherein to retrieve the weight bit from the respective columns, the control circuit is configured to activate a word line coupled to a respective data storage cell in each of the respective columns.

6. The apparatus of claim 5, wherein the control circuit includes a counter circuit configured to generate a plurality of count values, and wherein the control circuit is further configured to activate the word line using a corresponding one of the plurality of count values.

7. The apparatus of claim 6, wherein the control circuit includes a decoder circuit configured to decode the corresponding one of the plurality of count values to activate the word line.

8. The apparatus of claim 1, further comprising a plurality of multiplier circuits configured to perform multiplication operations, wherein a given one of the plurality of multiplier circuits includes:

a plurality of capacitors coupled to a common global bit line;

a plurality of switch devices coupled to receive a particular one of a plurality of activation signals, and wherein a given switch device of the plurality of switch devices is configured to couple, using a respective weight bit of a particular weight value, the particular activation signal to a corresponding one of the plurality of capacitors that is coupled to the given switch device; and a pre-charge device coupled between an input power supply node and the common global bit line, wherein the pre-charge device is configured to charge the common global bit line to a voltage level of the input power supply node.

9. The apparatus of claim 8, wherein the given multiplier circuit is configured to modify a voltage level of the common global bit line using the plurality of capacitors and weight bits of the particular weight value.

10. A method comprising:

storing, in a given column of a plurality of columns included in a first memory array circuit, a respective weight value of a plurality of weight values, wherein the respective weight value includes a plurality of weight bits;

performing, using a control circuit, a multiplication operation across a plurality of cycles, wherein performing the multiplication operation includes retrieving, during a given cycle of the plurality of cycles, a weight bit from respective columns of the plurality of columns to form a set of weight bits that includes a weight bit of each respective weight value stored in the respective columns;

combining, using a decoder circuit, a given weight bit of the set of weight bits with an operand bit from a respective one of a plurality of operands to generate a portion of a given product bit set of a plurality of product bit sets; and combining, using an adder circuit and in response to a determination that the multiplication operation has completed, the plurality of product bit sets to generate a result.

11. The method of claim 10, further comprising:

receiving, at ones of a plurality of switch devices, respective weight signals corresponding to weight bits of a particular weight value; and coupling, using the switch devices and based on the respective weight signals, an activation signal to ones of a plurality of capacitors, wherein the plurality of capacitors are further coupled to a common global bit line.

12. The method of claim 11, further comprising:

modifying a voltage level of the common global bit line based on an amount of charge of respective ones of the plurality of capacitors in response to coupling the activation signal capacitors.

13. The method of claim 11, further comprising pre-charging the common global bit line, wherein the pre-charging comprises coupling, using a pre-charge device, the common global bit line to an input power supply and charging the common global bit line to a voltage level of the input power supply.

14. The method of claim 10, further comprising:

storing, in a second memory array circuit, the plurality of product bit sets; and performing, in response to a determination that the multiplication operation has completed, a transpose operation on the stored plurality of product bits sets.

15. The method of claim 10, wherein the retrieving of a weight bit from the respective columns comprises:

activating, using the control circuit, a row of data storages cells formed across the respective columns, wherein a given data storage cell of the row is included in a respective one of the respective columns;

wherein the method further comprises:

generating, using a counter circuit, a plurality of count values; and activating the row using a corresponding one of the plurality of count values.

16. The method of claim 11, further comprising:

storing, in an input register, a first plurality of operand bits corresponding to a first bit position in the plurality of operands; and replacing, in response to a determination that a particular number of cycles has completed, the first plurality of operand bits with a second plurality of operand bits corresponding to a second bit position in the plurality of operands.

17. A system comprising:

a first memory circuit configured to store, in a given column of a plurality of columns of the first memory circuit, a respective weight value of a plurality of weight values, wherein the respective weight value includes a corresponding plurality of weight bits;

a control circuit configured to perform a multiplication operation across a plurality of cycles, wherein to perform a given cycle of the plurality of cycles, the control circuit is configured to retrieve a weight bit from respective columns of the plurality of columns to form a set of weight bits that includes a weight bit of each respective weight value stored in the respective columns; and a decoder circuit configured to:
- for a first set of cycles of the plurality of cycles, combine sets of weight bits of the plurality of weight values with a first set of operand bits that includes a respective operand bit from respective ones of a plurality of operands to generate product bit sets; and
- for a second set of cycles of the plurality of cycles, combine the sets of weight bits with a second set of operand bits that includes a different, respective operand bit from the respective operands to generate product bit sets.

18. The system of claim 17, further comprising an adder circuit configured, in response to a determination that the multiplication operation has completed, to combine a plurality of product bit sets to generate a result.

19. The system of claim 17, further comprising an input register configured to:
- store the first set of operand bits, wherein ones of the first set of operand bits correspond to a first bit position in the plurality of operands; and
- in response to a determination that the first set of cycles has completed, replace the first set of operand bits with the second set of operand bits, wherein ones of the second set of operand bits correspond to a second bit position in the plurality of operands.

20. The system of claim 17, further comprising a second memory circuit configured to:
- store product bit sets from the first and second sets of cycles; and
- in response to a determination that the multiplication operation has completed, perform a transpose operation on the stored product bits sets.

* * * * *